(12) United States Patent
Ota et al.

(10) Patent No.: US 11,634,639 B2
(45) Date of Patent: Apr. 25, 2023

(54) POLARIZING FILM, METHOD FOR MANUFACTURING SAME, POLARIZING PLATE, AND DISPLAY DEVICE

(71) Applicant: Sumitomo Chemical Company, Limited, Tokyo (JP)

(72) Inventors: Yosuke Ota, Osaka (JP); Nobuyuki Hatanaka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 92 days.

(21) Appl. No.: 17/059,061

(22) PCT Filed: May 27, 2019

(86) PCT No.: PCT/JP2019/020830
§ 371 (c)(1),
(2) Date: Nov. 25, 2020

(87) PCT Pub. No.: WO2019/230625
PCT Pub. Date: Dec. 5, 2019

(65) Prior Publication Data
US 2021/0207030 A1   Jul. 8, 2021

(30) Foreign Application Priority Data

Jun. 1, 2018 (JP) .............................. JP2018-105990

(51) Int. Cl.
| | | |
|---|---|---|
| *G02F 1/1335* | (2006.01) | |
| *C09K 19/38* | (2006.01) | |
| *C09K 19/56* | (2006.01) | |
| *C09K 19/60* | (2006.01) | |
| *G02B 5/30* | (2006.01) | |
| *G02B 1/08* | (2006.01) | |
| *G02F 1/13363* | (2006.01) | |
| *C09K 19/04* | (2006.01) | |

(52) U.S. Cl.
CPC .......... *C09K 19/3857* (2013.01); *C09K 19/56* (2013.01); *C09K 19/601* (2013.01); *G02B 1/08* (2013.01); *G02B 5/3016* (2013.01); *G02B 5/3083* (2013.01); *G02F 1/1335* (2013.01); *G02F 1/13363* (2013.01); *G02F 1/133528* (2013.01); *C09K 2019/0448* (2013.01); *C09K 2323/00* (2020.08); *C09K 2323/03* (2020.08); *C09K 2323/035* (2020.08)

(58) Field of Classification Search
CPC .. C09K 19/3857; C09K 19/56; C09K 19/601; C09K 2019/0448; C09K 2323/00; C09K 2323/03; C09K 2323/035; G02B 1/08; G02B 5/3016; G02B 5/3083; G02F 1/1335; G02F 1/13363; G02F 1/133528
USPC .......... 428/1.1, 1.3, 1.33; 349/194; 359/586, 359/489.07
See application file for complete search history.

(56) References Cited

U.S. PATENT DOCUMENTS

| | | |
|---|---|---|
| 2010/0267858 A1 | 10/2010 | Lub et al. |
| 2016/0216424 A1 | 7/2016 | Seo et al. |
| 2017/0123124 A1 | 5/2017 | Hatanaka et al. |

FOREIGN PATENT DOCUMENTS

| | | |
|---|---|---|
| JP | 2006284736 A | 10/2006 |
| JP | 2007510946 A | 4/2007 |
| JP | 2013037353 A | 2/2013 |
| JP | 2016139133 A | 8/2016 |
| JP | 2017083843 A | 5/2017 |

*Primary Examiner* — Ruiyun Zhang
(74) *Attorney, Agent, or Firm* — Panitch Schwarze Belisario & Nadel LLP

(57) ABSTRACT

A polarizing film including a polarizer that is a cured product of a polymerizable liquid crystal composition is provided. The polymerizable liquid crystal composition contains both a polymerizable liquid crystal compound having at least one polymerizable group and a dichroic coloring matter. The polarizer is laminated on a surface, having a pore size of 0.45 nm to 0.57 nm, of a base material. The pore size is obtained by converting, into a diameter, an average free volume radius calculated by a positron lifetime measurement method in which the positron lifetime is measured by irradiating the surface with positrons with an injection energy of 3 kV.

14 Claims, No Drawings

POLARIZING FILM, METHOD FOR MANUFACTURING SAME, POLARIZING PLATE, AND DISPLAY DEVICE

CROSS-REFERENCE TO RELATED APPLICATIONS

This application is a Section 371 of International Application No. PCT/JP2019/020830, filed May 27, 2019, which was published in the Japanese language on Dec. 5, 2019, under International Publication No. WO 2019/230625 A1, which claims priority under 35 U.S.C. § 119(b) to Japanese Application No. 2018-105990, filed Jun. 1, 2018, the disclosures of each of which are incorporated herein by reference in their entireties.

TECHNICAL FIELD

The present invention relates to a polarizing film and a method for manufacturing the same, a polarizing plate including the polarizing film, and a display device including the polarizing plate.

BACKGROUND ART

Conventionally, polarizing plates have been used in various image display panels such as liquid crystal display panels and organic electroluminescence (organic EL) display panels by being attached to image display elements such as liquid crystal cells and organic EL display elements. As such a polarizing plate, there has been known a polarizing plate having a configuration in which a protective layer such as a triacetyl cellulose film is laminated, via an adhesive layer, on at least one surface of a polarizer where a compound exhibiting dichroism such as iodine or a dichroic coloring matter is adsorbed and oriented in a polyvinyl alcohol-based resin film.

In recent years, there has been a continuous demand for thinning displays such as image display panels, so that there has also been a demand for further thinning a polarizing plate or a polarizer, each of which is one of the constituent elements thereof. In response to such a demand, a host-guest type polarizer having a reduced thickness, which is made of, for example, a polymerizable liquid crystal compound and a compound exhibiting dichroism, has been proposed (Patent Documents 1 to 3).

PRIOR ART DOCUMENTS

Patent Documents

Patent Document 1: JP-A-2007-510946
Patent Document 2: JP-A-2013-37353
Patent Document 3: JP-A-2017-083843

SUMMARY OF THE INVENTION

Problems to be Solved by the Invention

However, when attached to a polymer film such as a protective layer, an image display element, or the like, a host-guest type polarizer as described in Patent Document 1 may cause a problem in which a dichroic coloring matter contained in the polarizer is likely to diffuse into the polymer film or a pressure-sensitive adhesive layer depending on an external environmental condition to which the polarizer is exposed so that a polarization performance decreases over time due to the disturbance of anisotropy.

In order to solve such a problem, in the polarizing film described in Patent Document 2, a polarizing film, in which an orientation layer, a polarizing layer, and a protective layer are formed on a transparent base material, is arranged for a front plate (glass base material) by an in-cell method. However, a solvent drying step is indispensable for forming the protective layer that forms the polarizing film described in Patent Document 2, and a dichroic compound in a polarizer is likely to diffuse into the protective layer during the drying step depending on the types of a solvent species contained in a composition for forming the protective layer or the protective layer formed, which may cause a decrease in polarization performance over time.

In Patent Document 3, it is suggested that by sealing both sides of a polarizing film with a diffusion prevention layer, a dichroic coloring matter can be prevented from diffusing out of the polarizing film, so that an over-time decrease in optical performance of a polarizing plate can be suppressed. However, in a hydrophilic compound such as polyvinyl alcohol proposed as the diffusion prevention layer in Patent Document 3, a haze is likely to rise due to cracking, peeling, floating, etc., when the polarizing plate is exposed to an environment in which it is immersed in water, etc. Additionally, polyvinyl alcohol has a low tolerance for the deformation occurring when the polarizing plate is bent, and hence fine breakages are likely to be caused. These changes in appearance not only become appearance defects for a polarizing film that is required to have high transparency, but also may cause a deterioration in visibility when the polarizing film is used in displays such as various image display devices.

An object of the present invention is to provide a polarizing film exhibiting good heat resistance and water resistance, and preferably a polarizing film having a reduced thickness. Another object of the present invention is to provide a polarizing plate and a display device including the polarizing film.

Means for Solving the Problems

As a result of diligent studies to solve the above problems, the present inventors have completed the present invention. That is, the present invention provides the following preferred aspects.

[1] A polarizing film including a polarizer that is a cured product of a polymerizable liquid crystal composition containing both a polymerizable liquid crystal compound having at least one polymerizable group and a dichroic coloring matter, in which the polarizer is laminated on a surface, having a pore size of 0.45 nm to 0.57 nm, of a base material, the pore size being obtained by converting, into a diameter, an average free volume radius calculated by a positron lifetime measurement method in which the positron lifetime is measured by irradiating the surface with positrons with an injection energy of 3 kV.

[2] The polarizing film according to the above [1], in which an amount of change in haze, occurring when the polarizing film is immersed in warm water at 53° C. for 30 minutes, is 1.0 or less.

[3] The polarizing film according to the above [1] or [2], in which the dichroic coloring matter is an azo coloring matter.

[4] The polarizing film according to any one of the above [1] to [3], in which the polymerizable liquid crystal compound exhibits smectic liquid crystallinity.

[5] The polarizing film according to any one of the above [1] to [4], in which the polarizer exhibits a Bragg peak in an X-ray analysis measurement.

[6] The polarizing film according to any one of the above [1] to [5], in which the surface, on which the polarizer is laminated, of the base material is made of a cured layer of a curable composition containing a radically polymerizable monomer.

[7] The polarizing film according to any one of the above [1] to [6], in which the surface, on which the polarizer is laminated, of the base material is made of a cured layer of a curable composition containing a polymerizable monomer having a (meth)acryloyloxy group.

[8] The polarizing film according to any one of the above [1] to [7], in which the polarizer is laminated on the surface of the base material via a photo-orientation film.

[9] A polarizing plate including the polarizing film according to any one of the above [1] to [8] and a phase difference film, in which the phase difference film satisfies an expression (X):

$$100 \text{ nm} \leq Re(550) \leq 180 \text{ nm} \quad (X)$$

[where, Re (550) represents an in-plane phase difference value at a wavelength of 550 nm], and an angle between a slow axis of the phase difference film and an absorption axis of the polarizing film is substantially 45°.

[10] The polarizing plate according to the above [9], in which the phase difference film satisfies an expression (Y):

$$Re(450)/Re(550) < 1 \quad (Y)$$

[where, Re(450) and Re(550) represent in-plane phase difference values at wavelengths of 450 nm and 550 nm, respectively.]

[11] The polarizing plate according to the above [9] or [10], in which the phase difference film is made of a polymer of a polymerizable liquid crystal compound.

[12] A display device including the polarizing film according to any one of the above [1] to [8] or the polarizing plate according to any one of the above [8] to [11].

[13] A method for manufacturing a polarizing film, including:

forming a coating film of a polymerizable liquid crystal composition containing both a polymerizable liquid crystal compound having at least one polymerizable group and a dichroic coloring matter on a surface, having a pore size of 0.45 nm to 0.57 nm, of a base material, the pore size being obtained by converting, into a diameter, an average free volume radius calculated by a positron lifetime measurement method in which the positron lifetime is measured by irradiating the surface with positrons with an injection energy of 3 kV;

removing a solvent from the coating film;

causing the polymerizable liquid crystal compound to make a phase transition to a smectic phase by heating the polymerizable liquid crystal compound to a temperature higher than or equal to a temperature at which the polymerizable liquid crystal compound makes a phase transition to a liquid phase and then by lowering the temperature; and polymerizing the polymerizable liquid crystal compound while maintaining the smectic phase.

Effect of the Invention

According to the present invention, a polarizing film exhibiting good heat resistance and water resistance can be provided.

MODE FOR CARRYING OUT THE INVENTION

Hereinafter, embodiments of the present invention will be described in detail. The scope of the present invention is not limited to the embodiments described here, and various modifications can be made within a range where the gist of the present invention is not impaired.

<Polarizing Film>

A polarizing film of the present invention includes a base material and a polarizer laminated on the base material. In the polarizing film of the present invention, the polarizer is a cured product of a polymerizable liquid crystal composition containing both a polymerizable liquid crystal compound having at least one polymerizable group and a dichroic coloring matter. The base material has a surface having a pore size of 0.45 nm to 0.57 nm, the pore size being obtained by converting, into a diameter, an average free volume radius calculated by a positron lifetime measurement method in which the positron lifetime is measured by irradiating the surface with positrons with an injection energy of 3 kV. The polarizer is laminated on the surface of the base material.

The pore size of the surface, on which the polarizer is laminated, of the base material means a pore size of the outermost surface, on a side in which the polarizer is laminated, of the base material, and indicates a value obtained by converting, into a diameter, an average free volume radius R3 calculated by a positron lifetime measurement method in which the positron lifetime is measured by irradiating the surface with positrons with an injection energy of 3 kV. In the present invention, the outermost surface, on a side in which the polarizer is laminated, of the base material means a surface, on which the polarizer is laminated directly or via an orientation film, of the base material. The detailed measurement method of the pore size in the present invention is as described in examples described later.

In a polarizer manufactured by curing a polymerizable liquid crystal composition containing a polymerizable liquid crystal compound and a dichroic coloring matter, the polymerizable liquid crystal composition is polymerized and cured in a state in which the dichroic coloring matter is included in the polymerizable liquid crystal compound and the polymerizable liquid crystal compound and the dichroic coloring matter are oriented. But, compared with a conventionally used polarizer in which a dichroic coloring matter is adsorbed and oriented in a polyvinyl alcohol-based resin film, the dichroic coloring matter is less likely to be held by the polymer components, and hence the dichroic coloring matter thermally diffuses from the polarizer to another layer laminated with the polarizer in a high temperature environment, etc., and polarization performance tends to easily decrease over time. If the pore size of the surface, on which the polarizer is laminated, of the base material is more than 0.57 nm, a function of shielding the dichroic coloring matter in the polarizer is not sufficient in a high temperature environment, etc., and hence the dichroic coloring matter is likely to diffuse out of the polarizer, and an over-time decrease in polarization performance of the polarizing film is likely to be caused. On the other hand, if the pore size of the surface, on which the polarizer is laminated, of the base material is less than 0.45 nm, a tolerance for a deformation occurring when the polarizing film is bent is decreased, and hence whitening is caused due to occurrence of fine breakages, which may lower visibility when the polarizing film is used in displays such as various image display devices. Therefore, in the present invention, the pore size of the surface, on which the polarizer is laminated, of the base material is 0.57 nm or less, preferably 0.54 nm or less, more preferably 0.51 nm or less, and 0.45 nm or more, preferably 0.48 nm or more, more preferably 0.50 nm or more. When the pore size of the surface, on which the polarizer is laminated, of the base material is within the above range, a polarizing film excellent in polarization performance and visibility is obtained, the polarizing film not only being excellent in an effect of suppressing the dichroic coloring matter in the polarizer from diffusing out of the polarizer, but also being less likely to cause a deformation when bent. Further, since the surface of the base material has a predetermined pore size, the adhesion to the polarizer can be improved, which is advantageous from the viewpoint of processability and productivity of the polarizing film.

In the present invention, the base material is not particularly limited as long as it has a surface that satisfies the above pore size on the side in which the polarizer is laminated, and may have a single-layer structure or a multi-layer structure. In the present invention, the base material is usually formed to include a resin film, and may have a single-layer structure made of the single resin film, or a multi-layer structure in which a layer satisfying the above pore size is provided on the resin film. By using a resin film as the base material, a polarizing film having flexibility can be obtained, and a polarizing film that can be widely used in applications requiring flexibility such as, for example, a flexible display can be provided. In the present invention, when the polarizing film includes one or more layers between the resin film as the base material and the polarizer, the layers other than the orientation film (layer), of the one or more layers, that are located on the base material side are all considered as the base material. Therefore, regarding the pore size calculated by the positron lifetime measurement method, the outermost surface of the base material in the polarizing film in which one or more layers are provided between the resin film as the base material and the polarizer means the surface of the layer other than the orientation film (layer), of the one or more layers, that is located closest to the polarizer.

Examples of the resin that forms the resin film include: polyolefins such as polyethylene and polypropylene; cyclic olefin resins such as norbornene polymers; polyethylene terephthalate; polymethacrylic acid ester; polyacrylic acid ester; cellulose esters such as triacetyl cellulose, diacetyl cellulose, and cellulose acetate propionate; polyethylene naphthalate; polycarbonate; polysulfone; polyether sulfone; polyether ketone; polyphenylene sulfide; polyphenylene oxide; polyamide; and polyamideimide. From the viewpoint of availability, polyethylene terephthalate, polymethacrylic acid ester, cellulose ester, polyamide, polyamideimide, cyclic olefin resin, or polycarbonate is preferable. Cellulose ester is one in which some or all of the hydroxyl groups contained in cellulose are esterified, and is easily available on the market. A cellulose ester base material is also easily available on the market. Examples of the commercially available cellulose ester base material include "FUJITAC film" (Fujifilm Corporation); and "KCSUX2M", "KC8UY", and "KC4UY" (Konica Minolta Inc.). The properties required for the base material differ depending on the constitution of the polarizing film, but a base material having a phase difference property as small as possible is usually preferable. Examples of the base material having a phase difference property as small as possible include cellulose ester films having no phase difference such as Zero-TAC (Konica Minolta Opto Inc.) and Z-TAC (Fujifilm Corporation). The resin film may be stretched or unstretched, and the surface, on which the polarizer is not laminated, of the base material may be subjected to a hard coat treatment, antireflective treatment, antistatic treatment, or the like.

A resin film formed from a resin as described above is stretched while controlling tension, temperature, speed, etc., as stretching conditions, and a stretching ratio is appropriately adjusted. Thereby, the above pore size, which is calculated by the positron lifetime measurement method for surface, can be adjusted. In general, as the stretching ratio becomes larger, the crystallization of a resin film further progresses, so that the pore size can be reduced. As the base material that forms the polarizing film of the present invention, a resin film having the pore size, which is calculated by the positron lifetime measurement method, of 0.45 nm to 0.57 nm can be used alone.

The base material of the present invention may have a multi-layer structure in which a layer (hereinafter, also referred to as a cured product layer) having the pore size, calculated by the positron lifetime measurement method, within the range from 0.45 nm to 0.57 nm, is provided on a stretched or unstretched resin film formed from a resin as described above. By providing the cured product layer having the pore size on the surface of a resin film, various resin films can be used as the base material that forms the polarizing film without being limited by the pore size the resin film itself has. Therefore, in one embodiment of the present invention, the base material that forms the polarizing film has a resin film and a cured product layer, provided on the resin film which layer has the pore size, calculated by the positron lifetime measurement method, within the range from 0.45 nm to 0.57 nm; and is arranged in the outermost layer of the base material.

In the present invention, the cured product layer may be a cured layer of a curable composition containing a polymerizable monomer. As the curable composition that forms the cured product layer, a composition containing, as an essential component, a radically polymerizable monomer having a property of being polymerized and cured by an active radical or the like is preferable from the viewpoints of having a high reaction rate, easily obtaining a cured product layer having a uniform pore size, and effectively suppressing diffusion of the dichroic coloring matter in the polarizer.

In the present invention, examples of the radically polymerizable monomer suitable for forming the cured product layer include (meth)acrylate compounds such as polyfunctional (meth)acrylate compounds; urethane (meth)acrylate compounds such as polyfunctional urethane (meth)acrylate compounds; epoxy (meth)acrylate compounds such as polyfunctional epoxy (meth)acrylate compounds; carboxyl group-modified epoxy (meth)acrylate compounds; polyester (meth) acrylate compounds; etc. These may be used alone or in combination of two or more. Among them, as the polymerizable monomer, a polymerizable monomer having a (meth)acryloyloxy group is preferable, a polyfunctional (meth)acrylate compound is more preferable, and a polyfunctional acrylate compound is particularly preferable. By using a compound having a (meth)acryloyloxy group as the polymerizable monomer, a cured product layer having a desired pore size can be easily prepared, and an excellent shielding function for the dichroic coloring matter in the polarizer can be imparted to the resin film serving as the base material.

The polyfunctional (meth)acrylate compound means a compound having, in its molecule, two or more (meth)acryloyl groups, preferably (meth)acryloyloxy groups, and examples thereof include a bifunctional (meth)acrylate monomer having, in its molecule, two (meth)acryloyloxy groups, a trifunctional or higher (meth)acrylate monomer having, in its molecule, three or more (meth)acryloyloxy groups, etc. In the present description, the term "(meth) acrylate" means "acrylate" or "methacrylate", and the term "(meth)acryloyl" also means "acryloyl" or "methacryloyl."

The polyfunctional (meth)acrylate compound may contain one type or two or more types of polyfunctional (meth)acrylate compounds. When two or more types of polyfunctional (meth)acrylate compounds are contained, the numbers of (meth)acryloyloxy groups may be the same or different between the respective polyfunctional (meth)acrylate compounds.

Examples of the bifunctional (meth)acrylate monomer include alkylene glycol di(meth)acrylates such as ethylene glycol di(meth)acrylate, 1,3-butanediol di(meth)acrylate, 1,4-butanediol di(meth)acrylate, 1,6-hexanediol di(meth) acrylate, 1,9-nonanediol di(meth)acrylate, and neopentyl glycol di(meth)acrylate; polyoxyalkylene glycol di(meth) acrylates such as diethylene glycol di(meth)acrylate, triethylene glycol di(meth)acrylate, dipropylene glycol di(meth) acrylate, tripropylene glycol di(meth)acrylate, polyethylene glycol di(meth)acrylate, polypropylene glycol di(meth)acrylate, and polytetramethylene glycol di(meth)acrylate; di(meth)acrylates of halogen-substituted alkylene glycol such as tetrafluoroethylene glycol di(meth)acrylate; di(meth)acrylates of aliphatic polyol such as trimethylolpropane di(meth) acrylate, ditrimethylolpropane di(meth)acrylate, and pentaerythritol di(meth)acrylate; di(meth)acrylates of hydrogenated dicyclopentadiene or tricyclodecane dialkanol such as hydrogenated dicyclopentadienyl di(meth)acrylate and tricyclodecane dimethanol di(meth)acrylate; di(meth) acrylates of dioxane glycol or dioxane dialkanol such as 1,3-dioxane-2,5-diyl di(meth)acrylate [also known as dioxane glycol di(meth)acrylate]; di(meth)acrylates of bisphenol A or bisphenol F alkylene oxide adduct such as bisphenol A ethylene oxide adduct diacrylate and bisphenol F ethylene oxide adduct diacrylate; epoxy di(meth)acrylates of bisphenol A or bisphenol F such as acrylic acid adduct of bisphenol A diglycidyl ether and acrylic acid adduct of bisphenol F diglycidyl ether; silicone di(meth)acrylate; di(meth)acrylate of hydroxypivalate neopentyl glycol ester; 2,2-bis[4-(meth)acryloyloxyethoxyethoxyphenyl]propane; 2,2-bis[4-(meth)acryloyloxyethoxyethoxycyclonexyl]propane; di(meth)acrylates of 2-(2-hydroxy-1,1-dimethylethyl)-5-ethyl-5-hydroxymethyl-1,3-dioxane]; tris(hydroxyethyl)isocyanurate di(meth)acrylate; etc.

Examples of the trifunctional (meth)acrylate monomer include a monomer having, in its molecule, three (meth) acryloyloxy groups, and examples thereof include glycerin tri(meth)acrylate, trimethylol propane tri(meth)acrylate, ditrimethylol propane tri(meth)acrylate, pentaerythritol tri (meth)acrylate, reaction product between pentaerythritol tri (meth)acrylate and acid anhydride, caprolactone-modified trimethylol propane tri(meth)acrylate, caprolactone-modified pentaerythritol tri(meth)acrylate, ethylene oxide-modified trimethylol propane tri(meth)acrylate, ethylene oxide-modified pentaerythritol tri(meth)acrylate, propylene oxide-modified trimethylol propane tri(meth)acrylate, propylene oxide-modified pentaerythritol tri(meth)acrylate, isocyanurate tri(meth)acrylate, reaction product between caprolactone-modified pentaerythritol tri(meth)acrylate and acid anhydride, reaction product between ethylene oxide-modified pentaerythritol tri(meth)acrylate and acid anhydride, reaction product between propylene oxide-modified pentaerythritol tri(meth)acrylate and acid anhydride, and the like.

Examples of the tetrafunctional (meth)acrylate monomer include a monomer having, in its molecule, four (meth) acryloyloxy groups, and examples thereof include ditrimethylolpropane tetra(meth)acrylate, pentaerythritol tetra(meth)acrylate, dipentaerythritol tetra(meth)acrylate, tripentaerythritol tetra(meth)acrylate, caprolactone-modified pentaerythritol tetra(meth)acrylate, caprolactone-modified tripentaerythritol tetra(meth)acrylate, ethylene oxide-modified pentaerythritol tetra(meth)acrylate, ethylene oxide-modified tripentaerythritol tetra(meth)acrylate, propylene oxide-modified pentaerythritol tetra(meth)acrylate, propylene oxide-modified tripentaerythritol tetra(meth)acrylate, etc.

Examples of the pentafunctional (meth)acrylate monomer include dipentaerythritol penta(meth)acrylate, tripentaerythritol penta(meth)acrylate, reaction product between dipentaerythritol penta(meth)acrylate and acid anhydride, caprolactone-modified dipentaerythritol penta(meth)acrylate, caprolactone-modified tripentaerythritol penta(meth)acrylate, ethylene oxide-modified dipentaerythritol penta(meth) acrylate, ethylene oxide-modified tripentaerythritol penta (meth)acrylate, propylene oxide-modified dipentaerythritol penta(meth)acrylate, propylene oxide-modified tripentaerythritol penta(meth)acrylate, reaction product between caprolactone-modified dipentaerythritol penta(meth)acrylate and acid anhydride, reaction product between ethylene oxide-modified dipentaerythritol penta(meth)acrylate and acid anhydride, reaction product between propylene oxide-modified dipentaerythritol penta(meth)acrylate and acid anhydride.

Examples of the hexafunctional (meth)acrylate monomer include dipentaerythritol hexa(meth)acrylate, tripentaerythritol hexa(meth)acrylate, caprolactone-modified dipentaerythritol hexa(meth)acrylate, caprolactone-modified tripentaerythritol hexa(meth)acrylate, ethylene oxide-modified dipentaerythritol hexa(meth)acrylate, ethylene oxide-modified tripentaerythritol hexa(meth)acrylate, propylene oxide-modified dipentaerythritol hexa(meth)acrylate, and propylene oxide-modified tripentaerythritol hexa(meth)acrylate.

Examples of the heptafunctional (meth)acrylate monomer include tripentaerythritol hepta(meth)acrylate, reaction product between trypentaerythritol hepta(meth)acrylate and acid anhydride, caprolactone-modified tripentaerythritol hepta(meth)acrylate, reaction product between caprolactone-modified tripentaerythritol hepta(meth)acrylate and acid anhydride, ethylene oxide-modified tripentaerythritol hepta(meth)acrylate, reaction product between ethylene oxide-modified tripentaerythritol hepta(meth)acrylate and acid anhydride, propylene oxide-modified trypentaerythritol hepta(meth)acrylate, and reaction products between propylene oxide-modified trypentaerythritol hepta(meth)acrylate and acid anhydride.

As the octafunctional (meth)acrylate monomer, a monomer having, in its molecule, eight (meth)acryloyloxy groups is mentioned, and examples thereof include tripentaerythritol octa(meth)acrylate, caprolactone-modified tripentaerythritol octa(meth)acrylate, ethylene oxide-modified tripentaerythritol octa(meth)acrylate, and propylene oxide-modified tripentaerythritol octa(meth)acrylate.

The 4 to 8 functional acrylate monomers are preferable, and the 6 to 8 functional acrylate monomers are more preferable, because the crosslink density of the obtained cured product layer can be easily increased and a desired pore size can be easily obtained. Among them, dipentaerythritol hexaacrylate and tripentaerythritol octaacrylate are even more preferable from the viewpoint of durability and flexibility of a laminate.

In the present invention, the pore size of the obtained cured product layer can be adjusted to a desired range by controlling the molecular weight between cross-linking points and the number of cross-linking points of the polyfunctional (meth)acrylate compound. Specifically, as the molecular weight between cross-linking points becomes larger, a cross-linking density tends to become smaller while the pore size of the obtained cured product layer tends to become larger. On the other hand, as the number of cross-linking points becomes larger, a cross-linking density tends to become larger while the pore size of the obtained cured product tends to become smaller.

In the curable composition that forms the cured product layer on the surface of the base material, the content of the radically polymerizable monomer, preferably the polyfunctional (meth)acrylate compound, is preferably 50 parts by mass or more, and more preferably 60 parts by mass or more, based on 100 parts by mass of the solid content of the curable composition. When the content of the polyfunctional (meth)acrylate monomer is within the above range, a cured product layer having a desired pore size can be easily prepared and an excellent function of shielding the dichroic coloring matter can be imparted to the base material. In the present description, the solid content of the curable composition means, when a solvent is contained in the curable composition, the total amount of the components obtained by excluding the solvent from the curable composition.

Preferably, the curable composition that forms the cured product layer further contains a polyfunctional urethane (meth)acrylate compound in addition to the radically polymerizable monomer, preferably the polyfunctional (meth)acrylate compound.

The polyfunctional urethane (meth)acrylate compound is generally a reaction product among an isocyanate compound, a polyol compound, and a (meth)acrylate compound, and means a compound having, in its molecule, two or more (meth)acryloyloxy groups. The polyfunctional urethane (meth)acrylate compound functions as a cross-linking agent and has a large number of cross-linking points, and hence the cross-linked structure of the obtained cured product layer can be made dense and appropriate toughness can be imparted. Thereby, the cured product layer is made excellent in flexibility, and the resistance thereof for a deformation due to bending or the like can be improved.

It is preferable from the viewpoint of durability and flexibility that the polyfunctional urethane (meth)acrylate compound has 2 to 5 functional groups and the molecular weight thereof is within the range from 400 to 8000.

When the curable composition contains the urethane (meth)acrylate compound, the content thereof may be appropriately determined depending on the type of the polyfunctional (meth)acrylate compound to be used. In one embodiment of the present invention, the curable composition that forms the cured product layer includes the polyfunctional (meth)acrylate and the urethane (meth)acrylate compound preferably at a ratio of 95:5 to 50:50, and more preferably at a ratio of 90:10 to 70:30 (polyfunctional (meth)acrylate: urethane (meth)acrylate compound, mass ratio). By containing the polyfunctional (meth)acrylate and the urethane (meth)acrylate compound at the above mixing ratio, a high function of shielding the dichroic coloring matter and excellent flexibility can be imparted to the base material.

The curable composition that forms the cured product layer may contain a photopolymerization initiator. The photopolymerization initiator is not particularly limited as long as it can initiate curing of the curable compound by irradiation with active energy rays such as visible light, ultraviolet rays, X-rays, or electron beams. Specific examples thereof include: acetphenone-based initiators such as acetophenone, 3-methylacetophenone, benzyldimethylketal, 1-(4-isopropylphenyl)-2-hydroxy-2-methylpropane-1-one, 2-methyl-1-[4-(methylthio)phenyl]-2-morpholinopropane-1-one, and 2-hydroxy-2-methyl-1-phenylpropane-1-one; benzophenone-based initiators such as benzophenone, 4-chlorobenzophenone, and 4,4'-diaminobenzophenone; alkylphenone-based initiators such as 2,2-dimethoxy-1,2-diphenylethane-1-one, 1-hydroxy-cyclohexyl-phenyl-ketone; benzoin ether-based initiators such as benzoin propyl ether and benzoin ethyl ether; thioxanthone-based initiators such as 4-isopropyithioxanthone; acylphosphine oxide-based initiators such as bis(2,4,6-trimethylbenzoyl)-phenylphosphine oxide; and other initiators such as xanthone, fluorenone, camphorquinone, benzaldehyde, and anthraquinone. These photopolymerization initiators can be used alone or in combination of two or more.

When the curable composition contains the photopolymerization initiator, the content of the photopolymerization initiator is preferably 1 to 10 parts by mass, and more preferably 2 to 6 parts by mass, based on 100 parts by mass of the total amount of the curable compound. When the content of the photopolymerization initiator is more than or equal to the above lower limit, a polymerization initiation ability is sufficiently exhibited and curability is improved. On the other hand, when the content of the polymerization initiator is less than or equal to the above upper limit, the photopolymerization initiator is less likely to remain, and a decrease in visible light transmittance, etc., can be easily suppressed.

The curable composition that forms the cured product layer on the surface of the base material may contain, if necessary, additives such as an ultraviolet absorber, antistatic agent, stabilizer, antioxidant, colorant, and surface conditioner. The additives can be used alone or in combination of two or more. The content of the additive is preferably about 0.1 to 10% by mass based on the mass of the solid content of the curable composition.

The cured product layer is obtained, for example, as follows: After a solution (hereinafter, also referred to as a "cured product layer-forming composition"), which has been prepared by dissolving each component that forms the curable composition in a solvent, is coated onto a resin film that forms the base material, the solvent is dried and removed and the polymerizable component is cured.

The solvent may be any solvent that can dissolve the components that form the curable composition, and it can be appropriately selected from the group consisting of, for example: aliphatic hydrocarbons such as hexane and octane; aromatic hydrocarbons such as toluene and xylene; alcohols such as ethanol, 1-propanol, isopropanol, and 1-butanol; ketones such as methyl ethyl ketone and methyl isobutyl ketone; esters such as ethyl acetate, butyl acetate, and isobutyl acetate; glycol ethers such as ethylene glycol monomethyl ether, ethylene glycol monoethyl ether, diethylene glycol monoethyl ether, propylene glycol monomethyl ether, and propylene glycol monoethyl ether; esterified glycol ethers such as ethylene glycol monomethyl ether acetate and propylene glycol monomethyl ether acetate; etc. These solvents can be used alone or in combination of two or more. The type and content of the solvent are appropriately selected according to the types and contents of the components contained in the curable composition, the material, shape, and coating method of the resin film, the thickness of the cured product layer, and the like. The content of the solvent may be, for example, 10 to 10000 parts by mass, preferably 20 to 1000 parts by mass, and more preferably about 20 to 100 parts by mass, based on 100 parts by mass of the total amount of the components contained in the curable composition.

Examples of the method for coating the cured product layer-forming composition onto the resin film, etc., include known methods such as: coating methods including a spin coating method, extrusion method, gravure coating method, die coating method, bar coating method, applicator method, etc.; and printing methods including a flexographic method, etc.

Examples of the method for removing the solvent contained in the cured product layer-forming composition include a natural drying method, ventilation drying method, heat drying method, decompression drying method, etc.

When the base material includes a cured product layer on its surface, the thickness of the cured product layer is preferably 0.1 to 20 µm, more preferably 1 to 10 µm, and even more preferably 2 to 5 µm. When the thickness of the cured product layer is more than or equal to the above lower limit, a sufficient effect of suppressing diffusion of the dichroic coloring matter can be exhibited, while the thickness is less than or equal to the above upper limit, thin polarizing film can be obtained.

The base material that forms the polarizing film of the present invention may contain a layer other than the resin film and the cured product layer as long as the effects of the present invention are not impaired. Examples of such other layers include an antistatic layer, a hard coat layer provided on a surface of the base material that is opposite to the surface on which the polarizer is laminated, an anti-reflective layer, and a gas barrier layer.

The thickness of the base material is preferably 5 to 300 µm, more preferably 10 to 200 µm, and even more preferably 20 to 100 µm from the viewpoint of thinning the polarizing film. When the base material has a multi-layer structure including the cured product layer, etc., the thickness of the base material means the thickness of the entire multi-layer structure forming the base material.

The polarizer that forms the polarizing film of the present invention is a cured product of a polymerizable liquid crystal composition containing both a polymerizable liquid crystal compound having at least one polymerizable group and a dichroic coloring matter.

In the polarizing film of the present invention, a polymerizable liquid crystal compound (hereinafter, also referred to as a "polymerizable liquid crystal compound (A)") contained in a polymerizable liquid crystal composition (hereinafter, also referred to as a "polymerizable liquid crystal composition (A)") that forms the polarizer is a liquid crystal compound having at least one polymerizable group. Here, the polymerizable group refers to a group that can be involved in a polymerization reaction by an active radical, an acid, or the like generated from the polymerization initiator. Examples of the polymerizable group held by the polymerizable liquid crystal compound (A) include a vinyl group, vinyloxy group, 1-chlorovinyl group, isopropenyl group, 4-vinylphenyl group, acryloyloxy group, methacryloyloxy group, oxylanyl group, and oxetanyl group. Among them, a radically polymerizable group is preferable, an acryloyloxy group, methacryloyloxy group, vinyl group, and vinyloxy group are more preferable, and an acryloyloxy group and methacryloyloxy group are preferable.

In the present invention, the polymerizable liquid crystal compound (A) preferably exhibits smectic liquid crystallinity. By using a polymerizable liquid crystal compound exhibiting smectic liquid crystallinity, a polarizer having a high degree of orientation order can be formed. The liquid crystal state exhibited by the polymerizable liquid crystal compound (A) is a smectic phase (smectic liquid crystal state). From the viewpoint of achieving a higher degree of orientation order, the liquid crystal state is more preferably a higher-order smectic phase (higher-order smectic liquid crystal state). Here, the higher-order smectic phase means a smectic B phase, smectic D phase, smectic E phase, smectic F phase, smectic G phase, smectic H phase, smectic I phase, smectic J phase, smectic K phase, or smectic L phase. Among them, a smectic B phase, smectic F phase and smectic I phase are more preferable. The liquid crystallinity may be a thermotropic liquid crystal or a lyotropic liquid crystal, but the thermotropic liquid crystal is preferable because a film thickness can be precisely controlled. Additionally, the polymerizable liquid crystal compound (A) may be a monomer, but may be an oligomer or a polymer in which the polymerizable group is polymerized.

The polymerizable liquid crystal compound (A) is not particularly limited as long as it is a liquid crystal compound having at least one polymerizable group, and known polymerizable liquid crystal compounds can be used, but compounds exhibiting smectic liquid crystallinity are preferable. Examples of such a polymerizable liquid crystal compound include compounds represented by the following formula (A1) (hereinafter, also referred to as a "polymerizable liquid crystal compound (A1)"):

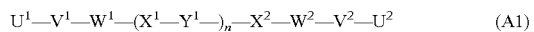

(A1)

[In the formula (A1), $X^1$ and $X^2$ each independently represent a divalent aromatic group or a divalent alicyclic hydrocarbon group, where: the hydrogen atom contained in the divalent aromatic group or the divalent alicyclic hydrocarbon group may be substituted with a halogen atom, an alkyl group having 1 to 4 carbon atoms, a fluoroalkyl group having 1 to 4 carbon atoms, an alkoxy group having 1 to 4 carbon atoms, a cyano group, or a nitro group; and the carbon atom forming the divalent aromatic group or the divalent alicyclic hydrocarbon group may be substituted with an oxygen atom, sulfur atom, or a nitrogen atom. However, at least one of $X^1$ and $X^2$ is a 1,4-phenylene group that may have a substituent or a cyclohexane-1,4-diyl group that may have a substituent.

$Y^1$ is a single bond or divalent linking group.

n is 1 to 3, and when n is 2 or more, a plurality of $X^1$s may be the same as or different from each other. $X^2$ may be the same as or different from any or all of the plurality of $X^1$s. When n is 2 or more, a plurality of Y's may be the same as or different from each other. It is preferable from the viewpoint of liquid crystallinity that n is 2 or more.

$U^1$ represents a hydrogen atom or a polymerizable group.

$U^2$ represents a polymerizable group.

$W^1$ and $W^2$ are each independently a single bond or divalent linking group.

$V^1$ and $V^2$ each independently represent an alkanediyl group having 1 to 20 carbon atoms that may have a substituent, and —$CH_2$— forming the alkanediyl group may be replaced with —O—, —CO—, —S—, or NH—.]

In the polymerizable liquid crystal compound (A1), $X^1$ and $X^2$ are, each independently, preferably a 1,4-phenylene group that may have a substituent or a cyclohexane-1,4-diyl group that may have a substituent. At least one of $X^1$ and $X^2$ is a 1,4-phenylene group that may have a substituent or a cyclohexane-1,4-diyl group that may have a substituent, and it is preferably a trans-cyclohexane-1,4-diyl group. Examples of the substituent, optionally held by the 1,4-phenylene group that may have a substituent or by the cyclohexane-1,4-diyl group that may have a substituent, include: alkyl groups each having 1 to 4 carbon atoms, such as a methyl group, ethyl group, and butyl group; a cyano group; and halogen atoms such as a chlorine atom and fluorine atom. Preferably, the 1,4-phenylene group and the cyclohexane-1,4-diyl group are unsubstituted.

Additionally, in the polymerizable liquid crystal compound (A1), the portion [hereinafter, referred to as a partial structure (A1-1)] of the formula (A1), represented by the formula (A1-1):

(A1-1)

[Where, $X^1$, $Y^1$, $X^2$, and n each have the same meanings as the above.]
preferably has an asymmetrical structure, because smectic liquid crystallinity is easily exhibited.

Examples of the polymerizable liquid crystal compound (A1) whose partial structure (A1-1) has an asymmetric structure include a polymerizable liquid crystal compound (A1) in which n is 1 and one $X^1$ and one $X^2$ have different structures from each other. The examples thereof also include:
a polymerizable liquid crystal compound (A1) in which n is 2, two Y's have the same structure as each other, two $X^1$s have the same structure as each other, and one $X^2$ has a different structure from these two $X^1$s; and a polymerizable liquid crystal compound (A1) in which n is 2, two $Y^1$s have the same structure as each other, $X^1$, of the two $X^1$s, bound to $W^1$ has a different structure from the other $X^1$ and $X^2$, and the other $X^1$ and $X^2$ have the same structure as each other. The examples thereof further include
a polymerizable liquid crystal compound (A1) in which n is 3, three $Y^1$s have the same structure as each other, and any one of the three $X^1$s and one $X^2$ has a different structure from all the other three.

$Y^1$ is preferably —$CH_2CH_2$—, —$CH_2O$—, —$CH_2CH_2O$—, —COO—, —OCOO—, single bond, —N=N—, —$CR^a$=$CR^b$—, —$CR^a$=N—, or —CO—$NR^a$—. $R^a$ and $R^b$ each independently represent a hydrogen atom or an alkyl group having 1 to 4 carbon atoms. $Y^1$ is more preferably —$CH_2CH_2$—, —COO—, or single bond, and when a plurality of Y's are present, the Y' that is bound to $X^2$ is more preferably —$CH_2CH_2$— or —$CH_2O$—. When $X^1$ and $X^2$ all have the same structure, it is preferred that two or more Y's having different bonding methods from each other are present. When there are a plurality of Y's having different bonding methods from each other, an asymmetrical structure is formed, so that smectic liquid crystallinity tends to be easily exhibited.

$U^2$ is a polymerizable group. $U^1$ is a hydrogen atom or a polymerizable group, and preferably a polymerizable group. Both $U^1$ and $U^2$ are preferably polymerizable groups, and both are preferably radically polymerizable groups. Examples of the polymerizable group include the same groups as those described above as the polymerizable group held by the polymerizable liquid crystal compound (A). The polymerizable group represented by $U^1$ and the polymerizable group represented by $U^2$ may be different from each other, but are preferably groups of the same type. Additionally, the polymerizable group may be in a polymerized state or an unpolymerized state, but is preferably in an unpolymerized state.

Examples of the alkanediyl groups represented by $V^1$ and $V^2$ include a methylene group, ethylene group, propane-1,3-diyl group, butane-1,3-diyl group, butane-1,4-diyl group, pentane-1,5-diyl group, hexane-1,6-diyl group, heptane-1,7-diyl group, octane-1,8-diyl group, decane-1,10-diyl group, tetradecane-1,14-diyl group, icosan-1,20-diyl group, etc. $V^1$ and $V^2$ are preferably an alkanediyl group having 2 to 12 carbon atoms, and more preferably an alkanediyl group having 6 to 12 carbon atoms.

Examples of the substituent optionally held by the alkanediyl group include a cyano group, and a halogen atom. The alkanediyl group is preferably unsubstituted, and more preferably an unsubstituted linear alkanediyl group.

$W^1$ and $W^2$ are, each independently, preferably single bond, —O—, —S—, —COO—, or —OCOO—, and more preferably single bond or —O—.

The polymerizable liquid crystal compound (A) is not particularly limited as long as it is a polymerizable liquid crystal compound having at least one polymerizable group, and a known polymerizable liquid crystal compound can be used, it preferably exhibits smectic liquid crystallinity. Preferably, a structure that easily exhibits smectic liquid crystallinity has, in its molecular structure, an asymmetric molecular structure.

Specifically, the polymerizable liquid crystal compound (A) is more preferably a polymerizable liquid crystal compound that has one of the following partial structures (A-a) to (A-i) and exhibits smectic liquid crystallinity. From the viewpoint of easily exhibiting higher-order smectic liquid crystallinity, it is more preferable to have the partial structure of (A-a), (A-b), or (A-c). In the following (A-a) to (A-i), * represents a bond (single bond).

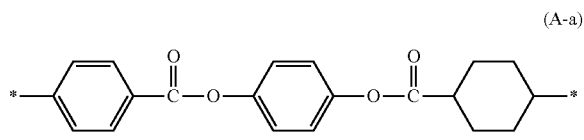
(A-a)

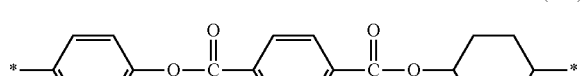
(A-b)

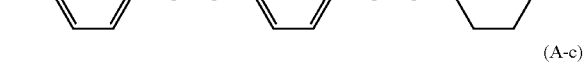
(A-c)

(A-d)

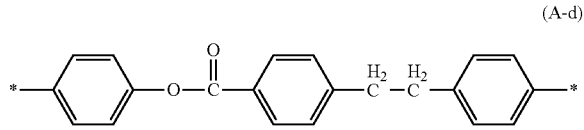
(A-e)

(A-f)

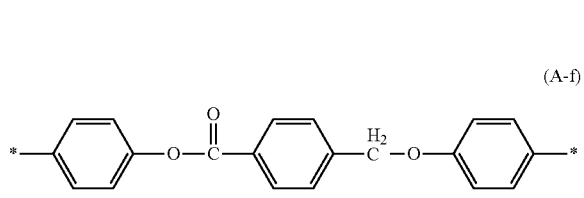

(A-g)
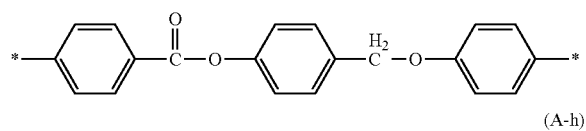
(A-h)
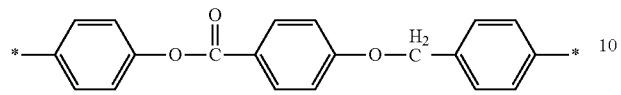
(A-i)
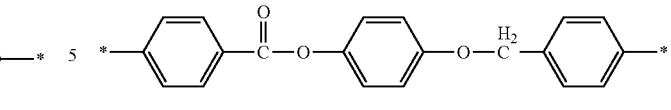
Specific examples of the polymerizable liquid crystal compound (A) include compounds represented by formulae (A-1) to (A-25). When the polymerizable liquid crystal compound (A) has a cyclohexane-1,4-diyl group, the cyclohexane-1,4-diyl group preferably has a trans-form.
(A-1)
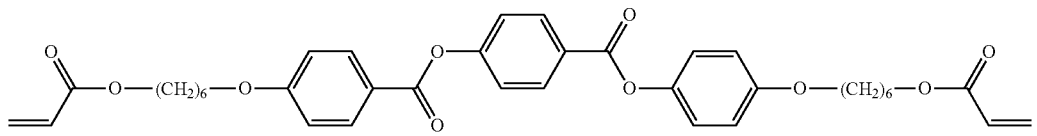
(A-2)
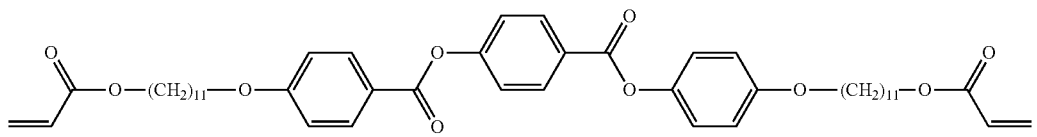
(A-3)
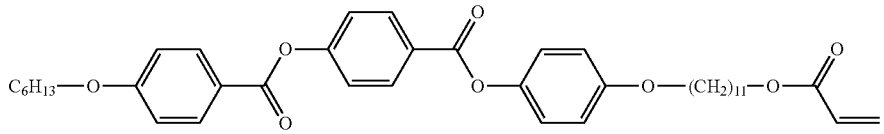
(A-4)
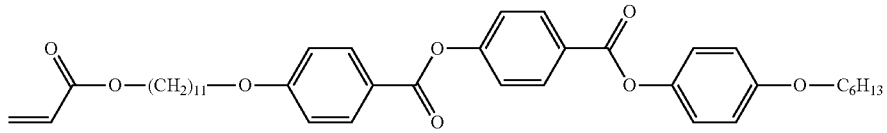
(A-5)
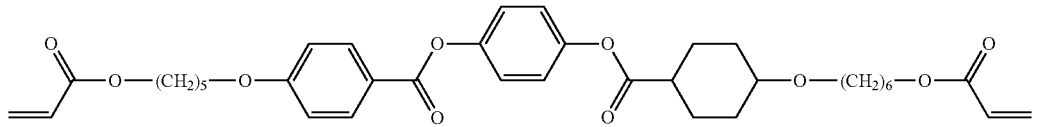
(A-6)
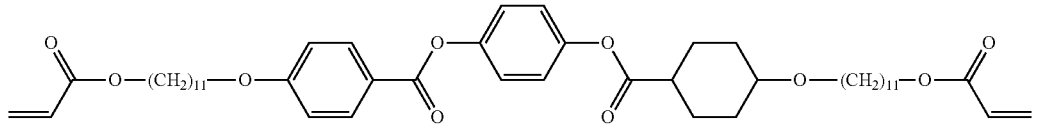
(A-7)
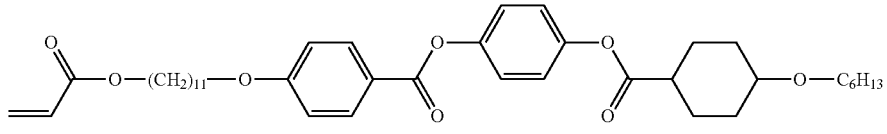
(A-8)
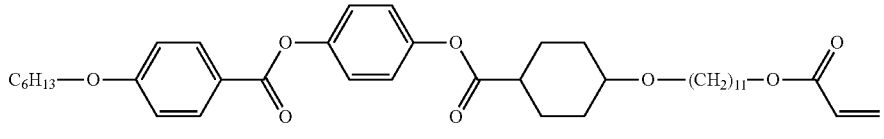
(A-9)
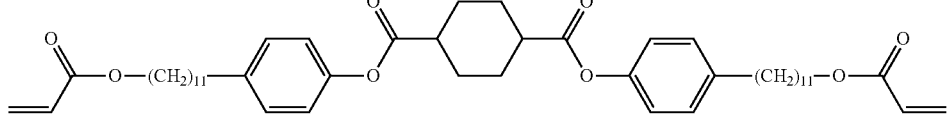

-continued
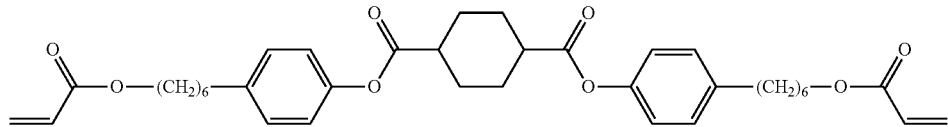
(A-10)
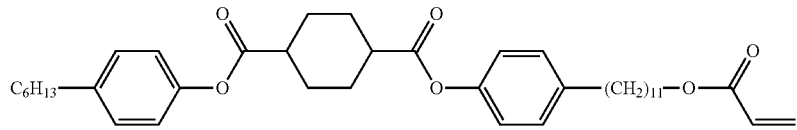
(A-11)
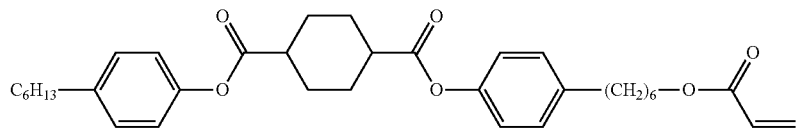
(A-12)
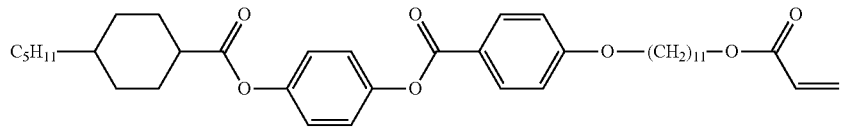
(A-13)
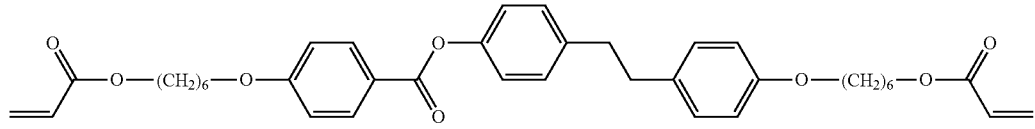
(A-14)
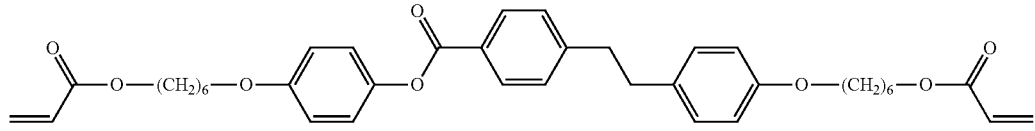
(A-15)
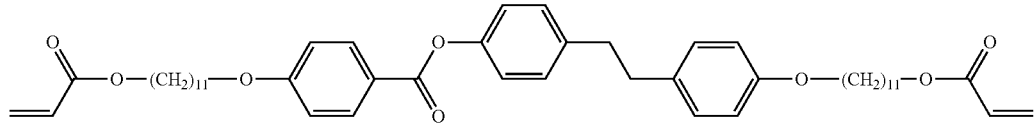
(A-16)
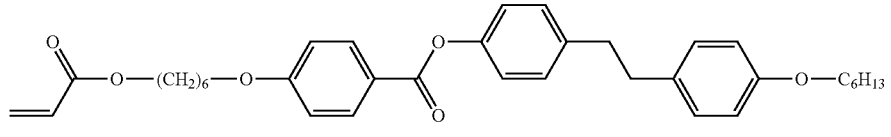
(A-17)
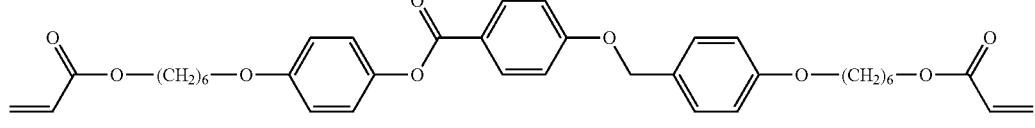
(A-18)
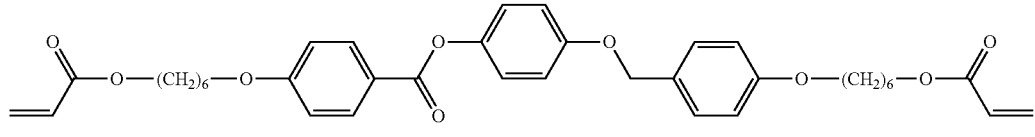
(A-19)
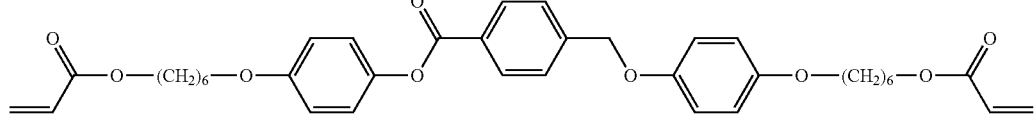
(A-20)

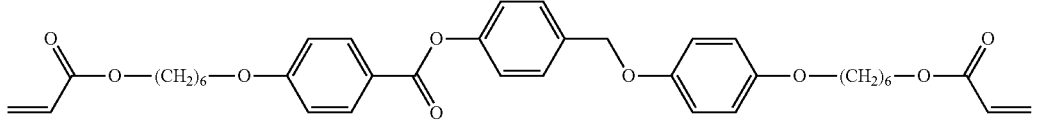

(A-21)

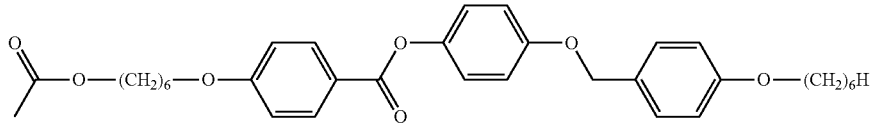

(A-22)

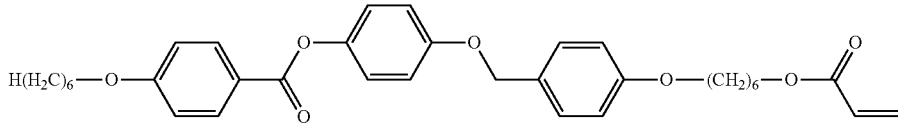

(A-23)

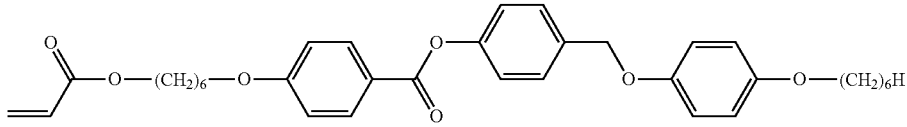

(A-24)

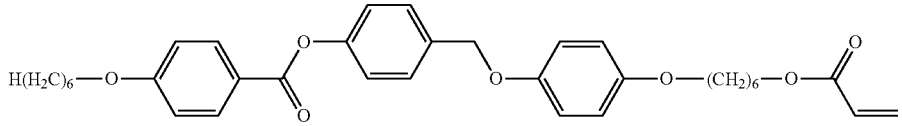

(A-25)

Among them, preferred is at least one type selected from the group consisting of compounds represented by the formula (A-2), formula (A-3), formula (A-4), formula (A-5), formula (A-6), formula (A-7), formula (A-8), formula (A-13), formula (A-14), formula (A-15), formula (A-16), and formula (A-17). As the polymerizable liquid crystal compound (A), one type may be used alone, or two or more types may be used in combination.

The polymerizable liquid crystal compound (A) can be produced by a known method described in, for example, Lub et al., Recl. Tray. Chim. Pays-Bas, 115, 321-328 (1996), or Japanese Patent No. 4719156.

In the present invention, the polymerizable liquid crystal composition (A) may contain a polymerizable liquid crystal compound other than the polymerizable liquid crystal compound (A). But, from the viewpoint of obtaining a polarizing film having a high degree of orientation order, the ratio of the polymerizable liquid crystal compound (A) to the total mass of all the polymerizable liquid crystal compounds contained in the polymerizable liquid crystal composition (A) is preferably 51% by mass or more, more preferably 70% by mass or more, and even more preferably 90% by mass or more.

When the polymerizable liquid crystal composition (A) contains two or more types of the polymerizable liquid crystal compounds (A), at least one of them may be the polymerizable liquid crystal compound (A1), or all of them may be the polymerizable liquid crystal compound (A1). By combining a plurality of polymerizable liquid crystal compounds, the liquid crystallinity can sometimes be temporarily maintained even at a temperature lower than or equal to a liquid crystal-crystal phase transition temperature.

The content of the polymerizable liquid crystal compound in the polymerizable liquid crystal composition (A) is preferably 40 to 99.9% by mass, more preferably 60 to 99% by mass, and even more preferably 70 to 99% by mass, based on the solid content of the polymerizable liquid crystal composition (A). When the content of the polymerizable liquid crystal compound is within the above range, there is a tendency that the orientation of the polymerizable liquid crystal compound becomes high. In the present description, the solid content means the total amount of the components obtained by excluding the solvent from the polymerizable liquid crystal composition (A).

In the present invention, the polymerizable liquid crystal composition (A) that forms the polarizer contains a dichroic coloring matter. Here, the dichroic coloring matter means a coloring matter having a property that the absorbance in the major axis direction of the molecule and the absorbance in the minor axis direction are different. The dichroic coloring matter that can be used in the present invention is not particularly limited as long as it has the above property, and it may be a dye or a pigment. Also, two or more types of dyes or pigments may be used in combination, or a dye and a pigment may be used in combination.

Preferably, the dichroic coloring matter has a maximum absorption wavelength ($\lambda_{MAX}$) within the range from 300 to 700 nm. Examples of such a dichroic coloring matter include an acridine coloring matter, oxazine coloring matter, cyanine coloring matter, naphthalene coloring matter, azo coloring matter and anthraquinone coloring matter.

Examples of the azo coloring matter include a monoazo coloring matter, bisazo coloring matter, trisazo coloring matter, tetrakisazo coloring matter, and stilbene azo coloring matter. Preferred is a bisazo coloring matter and a trisazo coloring matter, examples of which include a compound represented by the formula (I) (hereinafter, also referred to as a "compound (I)"):

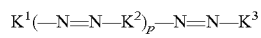

(I)

[In the formula (I), K1 and $K^3$ each independently represent a phenyl group that may have a substituent, a naphthyl group that may have a substituent, or a monovalent heterocyclic group that may have a substituent. $K^2$ represents a p-phenylene group that may have a substituent, a naphthalene-1,4-diyl group that may have a substituent, or a divalent heterocyclic group that may have a substituent. p represents an integer from 1 to 4. When p is an integer more than or equal to 2, a plurality of Kgs may be the same as or different from each other. The —N=N— bond may be replaced with —C=C—, —COO—, —NHCO—, or —N=CH— bond within a range where absorption is exhibited in the visible region.]

Examples of the monovalent heterocyclic group include groups obtained by removing one hydrogen atom from heterocyclic compounds such as quinoline, thiazole, benzothiazole, thienothiazole, imidazole, benzimidazole, oxazole, and benzoxazole. Examples of the divalent heterocyclic group include groups obtained by removing two hydrogen atoms from the heterocyclic compounds.

The substituents that are optionally held, in $K^1$ and by the phenyl groups, the naphthyl groups, and the monovalent heterocyclic groups and held, in $K^2$, by the p-phenylene group, the naphthalene-1,4-diyl group, and the divalent heterocyclic group, mean: alkyl groups having 1 to 4 carbon atoms; alkoxy groups having 1 to 4 carbon atoms such as methoxy group, ethoxy group, and butoxy group; alkyl fluoride groups having 1 to 4 carbon atoms such as trifluoromethyl group; cyano group; nitro group; halogen atoms; substituted or unsubstituted amino groups such as amino group, diethylamino group, and pyrrolidino group (the substituted amino group means an amino group having one or two alkyl groups having 1 to 6 carbon atoms, or an amino group in which two substituted alkyl groups are bound to each other to form an alkanediyl group having 2 to 8 carbon atoms. The unsubstituted amino group is —$NH_2$).

Among the compounds (I), Preferred is a compound represented by any one of the following formulae (I-1) to (I-8).

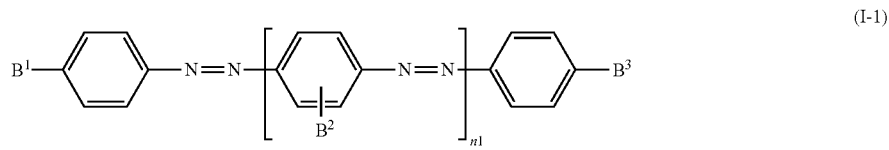
(I-1)

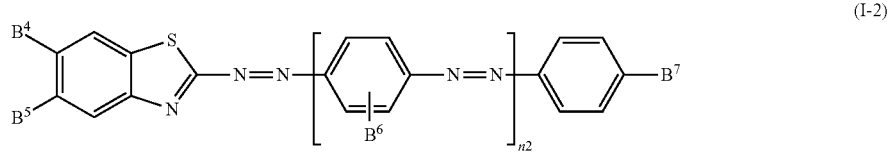
(I-2)

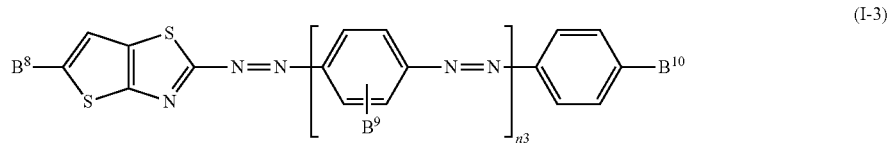
(I-3)

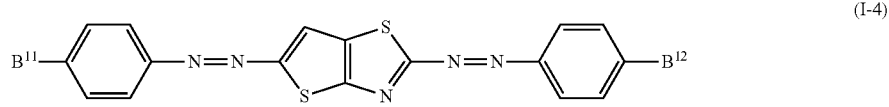
(I-4)

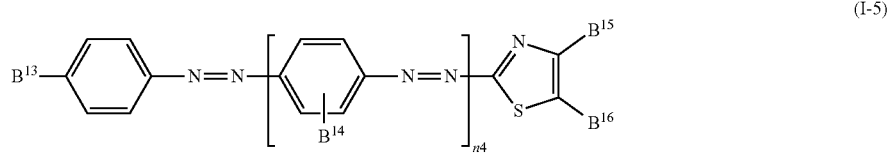
(I-5)

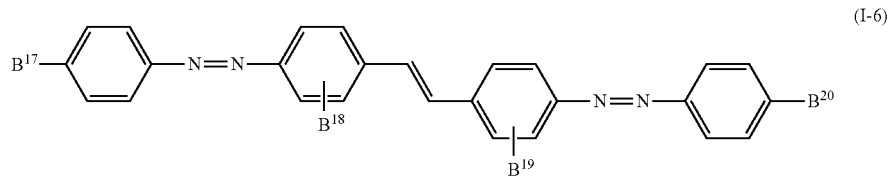
(I-6)

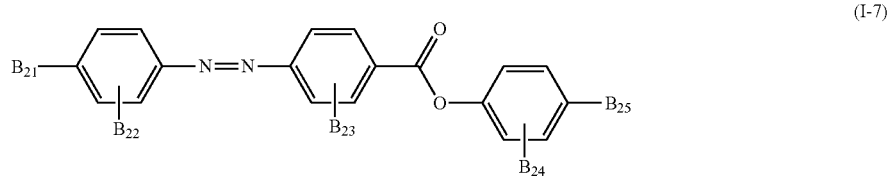
(I-7)

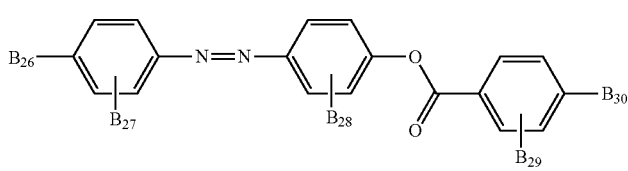

[In the formulae (I-1) to (I-8), $B^1$ to $B^{30}$ each independently represent a hydrogen atom, alkyl group having 1 to 6 carbon atoms, alkoxy group having 1 to 4 carbon atoms, cyano group, nitro group, substituted or unsubstituted amino group (the substituted amino group and unsubstituted amino group are defined as described above), chlorine atom, or trifluoromethyl group.

n1 to n4 each independently represent an integer from 0 to 3.

When n1 is 2 or more, a plurality of $B^2$s may be the same as or different from each other.

When n2 is 2 or more, a plurality of $B^6$s may be the same as or different from each other.

When n3 is 2 or more, a plurality of may be the same as or different from each other.

When n4 is 2 or more, a plurality of $B^{14}$s may be the same as or different from each other.

The anthraquinone coloring matter is preferably represented by the formula (I-9).

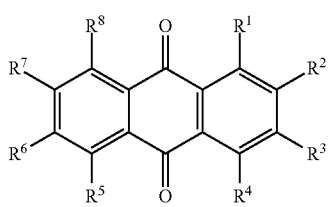

[In the formula (I-9), $R^1$ to $R^8$ each independently represent a hydrogen atom, —$R^x$, —$NH_2$, —$NHR^x$, —$NR^x_2$, —$SR^x$, or halogen atom.

$R^x$ represents an alkyl group having 1 to 4 carbon atoms or an aryl group having 6 to 12 carbon atoms.]

The oxazone coloring matter is preferably represented by the formula (I-10).

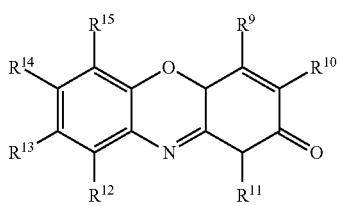

[In the formula (I-10), $R^9$ to $R^{15}$ each independently represent a hydrogen atom, —$R^x$, —$NH_2$, —$NHR^x$, —$NR^x_2$, —$SR^x$, or halogen atom.

$R^x$ represents an alkyl group having 1 to 4 carbon atoms or an aryl group having 6 to 12 carbon atoms.]

The acridine coloring matter is preferably represented by the formula (I-11).

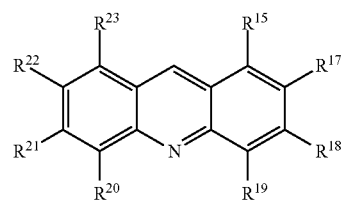

[In the formula (I-11), $R^{16}$ to $R^{23}$ each independently represent a hydrogen atom, —$R^x$, —$NH_2$, —$NHR^x$, —$NR^x_2$, —$SR^x$, or halogen atom.

$R^x$ represents an alkyl group having 1 to 4 carbon atoms or an aryl group having 6 to 12 carbon atoms.]

Examples of the alkyl groups having 1 to 6 carbon atoms represented by $R^x$, in the formula (I-9), formula (I-10), and formula (I-11), include a methyl group, ethyl group, propyl group, butyl group, pentyl group, hexyl group, etc. Examples of the aryl groups having 6 to 12 carbon atoms include a phenyl group, toluyl group, xylyl group, naphthyl group, etc.

The cyanine coloring matter is preferably represented by the formula (I-12) and a compound represented by the formula (I-13).

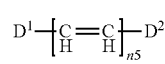

[In the formula (I-12), $D^1$ and $D^2$ each independently represent a group represented by any one of the formulae (I-12a) to (I-12d).

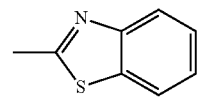

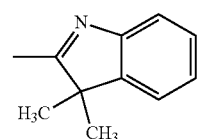

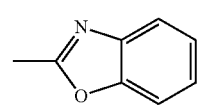

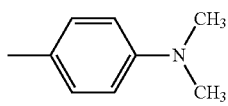
(I-12d)

n5 represents an integer from 1 to 3.]

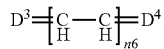
(I-13)

[In the formula (I-13),

D³ and D⁴ each independently represent a group represented by any one of the formulae (I-13a) to (I-13h).

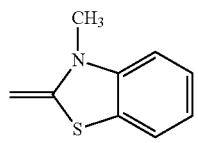
(I-13a)

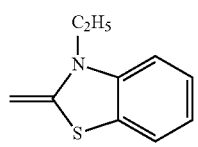
(I-13b)

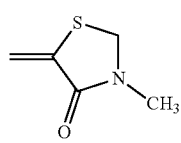
(I-13c)

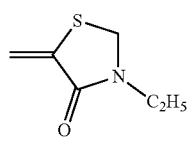
(I-13d)

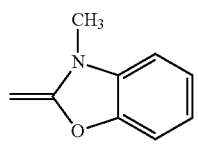
(I-13e)

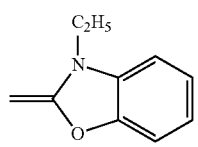
(I-13f)

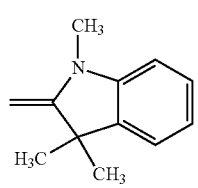
(I-13g)

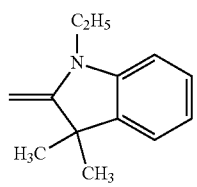
(I-13h)

n6 represents an integer from 1 to 3.]

Among these dichroic coloring matters, the azo coloring matter is suitable for producing a polarizer having excellent polarization performance because of its high linearity. But in a polarizing film including a high-performance polarizer, the optical characteristics of the film are greatly affected even if a very small amount of the coloring matter diffuses out of the polarizer. Even with such a polarizer, the configuration of the polarizing film of the present invention, in which the polarizer is laminated on the surface, having the specific pore size, of the base material, can effectively suppress diffusion (particularly thermal diffusion) of the dichroic coloring matter. Thereby, the effects of the present invention can be remarkably exhibited. Therefore, in one embodiment of the present invention, it is preferable that the dichroic coloring matter contained in the polymerizable liquid crystal composition that forms the polarizer is an azo coloring matter.

In the present invention, the weight average molecular weight of the dichroic coloring matter is usually 300 to 2000, and preferably 400 to 1000. When the weight average molecular weight of the dichroic coloring matter is less than or equal to the above upper limit, the dichroic coloring matter existing, in the polarizer, in the state of being included in the polymerizable liquid crystal compound easily moves, and hence it is likely to diffuse out of the polarizer in a high temperature environment or the like. Even in such a case, the configuration of the polarizing film of the present invention, in which the polarizer is laminated on the surface, having the specific pore size, of the base material, can effectively suppress diffusion (particularly thermal diffusion) of the dichroic coloring matter. Thereby, the effects of the present invention can be remarkably exhibited.

Further, in one embodiment of the present invention, both the dichroic coloring matter contained in the polymerizable liquid crystal composition (A) that forms the polarizer and the surface (cured product layer) having the specific pore size, on which the polarizer is laminated, of the base material are hydrophobic, and more preferably the dichroic coloring matter contained in the polymerizable liquid crystal composition (A) and the entire base material including the surface having the specific pore size, on which the polarizer is laminated, are preferably hydrophobic. When both the dichroic coloring matter and the surface of the base material are hydrophobic, the compatibility between the surface of the base material and the dichroic coloring matter becomes high, so that the dichroic coloring matter is likely to diffuse out of the polarizer. In the polarizing film of the present invention, when the pore size of the surface, on which the polarizer is laminated, of the base material is controlled to be within the above specific range, and the dichroic coloring matter and the surface of the base material or the entire base material are both made hydrophobic, an improvement in water resistance can also be achieved while ensuring a high shielding function for the dichroic coloring matter.

In the present invention, the hydrophobic dichroic coloring matter means a coloring matter having a solubility in 100 g of water at 25° C. of 1 g or less. Additionally, the hydrophobic surface (cured product layer) of the base material means the surface (cured product layer) of the base material having a contact angle with water of 50° or more. The fact that the entire base material is hydrophobic means that the resin film serving as the base material. When the base material has a multi-layer structure, the surfaces of the respective layers that form the base material respectively have a contact angle with water of 50° or more.

The content of the dichroic coloring matter in the polymerizable liquid crystal composition (A) can be appropriately determined depending, for example, on the type of the dichroic coloring matter to be used, but it is preferably 0.1 to 50 parts by mass, more preferably 0.1 to 20 parts by mass, and even more preferably 0.1 to 12 parts by mass, based on 100 parts by mass of the polymerizable liquid crystal compound. When the content of the dichroic coloring matter is within the above range, a polarizer having a high degree of orientation order can be obtained, in which the orientation of the polymerizable liquid crystal compound is less likely to be disturbed.

In the present invention, the polymerizable liquid crystal composition (A) for forming the polarizer may contain a polymerization initiator. The polymerization initiator is a compound capable of initiating the polymerization reaction of a polymerizable liquid crystal compound. From the viewpoint of being capable of initiating the polymerization reaction under a lower temperature condition, the polymerization initiator is preferably a photopolymerization initiator. Specific examples thereof include photopolymerization initiators capable of generating an active radical or an acid by the action of light. Among them, a photopolymerization initiator preferably generates a radical by the action of light. The polymerization initiators can be used alone or in combination of two or more.

A known photopolymerization initiator can be used as the photopolymerization initiator. Examples of the photopolymerization initiator that generates an active radical include a self-cleaving type photopolymerization initiator and a hydrogen abstraction type photopolymerization initiator.

As the self-cleaving type photopolymerization initiator, a self-cleaving type benzoin compound, acetophenone compound, hydroxyacetophenone compound, α-aminoacetophenone compound, oxime ester compound, acylphosphine oxide compound, azo compound can be used. As the hydrogen abstraction type photopolymerization initiator, a hydrogen abstraction type benzophenone compound, benzoin ether compound, benzyl ketal compound, dibenzosuberone compound, anthraquinone compound, xanthone compound, thioxanthone compound, halogenoacetophenone compound, dialkoxyacetophenone compound, halogenobis imidazole compound, halogenotriazine compound, triazine compound, can be used.

As the photopolymerization initiator that generates an acid, an iodonium salt, sulfonium salt can be used.

Among them, the self-cleaving type photopolymerization initiator is preferable from the viewpoint of a reaction efficiency at a low temperature because a reaction at a low temperature is preferable from the viewpoint of preventing dissolution of the coloring matter. In particular, an acetophenone compound, hydroxyacetophenone compound, α-aminoacetophenone compound, and oxime ester compound are preferable.

Specific examples of the photopolymerization initiator include the following:

Benzoin compounds such as benzoin, benzoin methyl ether, benzoin ethyl ether, benzoin isopropyl ether, and benzoin isobutyl ether;

hydroxyacetophenone compounds such as 2-hydroxy-2-methyl-1-phenylpropane-1-one, 1,2-diphenyl-2,2-dimethoxyethane-1-one, 2-hydroxy-2-methyl-1-[4-(2-hydroxyethoxy)phenyl]propane-1-one, 1-hydroxycyclohexylphenylketone, and oligomer of 2-hydroxy-2-methyl-1-[4-(1-methylvinyl)phenyl]propane-1-one;

α-aminoacetophenone compounds such as 2-methyl-2-morpholino-1-(4-methylthiophenyl)propane-1-one and 2-dimethylamino-2-benzyl-1-(4-morpholinophenyl)butane-1-one;

oxime ester compounds such as 1,2-octanedione, 1-[4-(phenylthio)-, 2-(o-benzoyloxime)], ethanone, and 1-[9-ethyl-6-(2-methylbenzoyl)-9H-carbazole-3-yl]-, 1-(o-acetyloxime);

acylphosphine oxide compounds such as 2,4,6-trimethylbenzoyldiphenylphosphine oxide and bis(2,4,6-trimethylbenzoyl)phenylphosphine oxide;

benzophenone compounds such as benzophenone, o-methy benzoyl benzoate, 4-phenylbenzophenone, 4-benzoyl-4'-methyldiphenyl sulfide, 3,3',4,4'-tetra(tert-butylperoxycarbonyl)benzophenone, and 2,4,6-trimethylbenzophenone;

dialkoxyacetophenone compounds such as diethoxyacetophenone; and triazine compounds such as 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine.

The photopolymerization initiator may be appropriately selected, for example, from the above photopolymerization initiators in relation to the polymerizable liquid crystal compound contained in the polymerizable liquid crystal composition (A).

Alternatively, a commercially available photopolymerization initiator may be used. Examples of the commercially available polymerization initiator include Irgacure (registered trademark) 907, 184, 651, 819, 250, 369, 379, 127, 754, OXE01, OXE02, and OXE03 (manufactured by BASF); Omnirad BCIM, Esacure 1001M, and Esacure KIP160 (manufactured by IDM Resins B.V.); SEIKUOL (registered trademark) BZ, Z, and BEE (manufactured by Seiko Chemical Co., Ltd.); kayacure (registered trademark) BP100 and UVI-6992 (manufactured by Dow Chemical Co., Ltd.); ADEKA OPTOMER SP-152, N-1717, N-1919, and SP-170, Adeka Arcles NCI-831, Adeka Arcles NCI-930 (manufactured by ADEKA Corporation); TAZ-A and TAZ-PP (manufactured by Nippon Shibel Hegner Co., Ltd.); and TAZ-104 (manufactured by Sanwa Chemical Co., Ltd.); etc.

The content of the polymerization initiator in the polymerizable liquid crystal composition (A) for forming the polarizer is preferably 1 to 10 parts by mass, more preferably 1 to 8 parts by mass, even more preferably 2 to 8 parts by mass, and particularly preferably 4 to 8 parts by mass, based on 100 parts by mass of the polymerizable liquid crystal compound. When the content of the polymerization initiator is within the range from the above upper limit to the above lower limit, the polymerization reaction of the polymerizable liquid crystal compound can be performed without significantly disturbing the orientation of the polymerizable liquid crystal compound.

The polymerization rate of the polymerizable liquid crystal compound in the present invention is preferably 60% or more, more preferably 65% or more, and even more preferably 70% or more, from the viewpoint of line contamination and handling during manufacturing.

The polymerizable liquid crystal composition (A) may further contain a photosensitizer. By using a photosensitizer, the polymerization reaction of the polymerizable liquid crystal compound can be further promoted. Examples of the photosensitizer include xanthone compounds such as xanthone and thioxanthone (e.g., 2,4-diethylthioxanthone, 2-isopropylthioxanthone, etc.); anthracene compounds such as anthracene and alkoxy group-containing anthracene (e.g., dibutoxyanthracene, etc.); phenothiazine; and rubrene. The photosensitizers can be used alone or in combination of two or more.

When the polymerizable liquid crystal composition (A) contains the photosensitizer, the content thereof may be appropriately determined according to the types and amounts of the polymerization initiator and the polymerizable liquid crystal compound. The content thereof is preferably 0.1 to 30 parts by mass, more preferably 0.5 to 10 parts by mass, and even more preferably 0.5 to 8 parts by mass, based on 100 parts by mass of the polymerizable liquid crystal compound.

The polymerizable liquid crystal composition (A) may contain a leveling agent. The leveling agent has a function of adjusting the fluidity of the polymerizable liquid crystal composition and further flattening the coating film obtained by coating the polymerizable liquid crystal composition. A specific example thereof includes a surfactant. As the leveling agent, preferred is at least one selected from the group consisting of leveling agents containing, as a main component, a polyacrylate compound and leveling agents containing, as a main component, a fluorine atom-containing compound. The leveling agents can be used alone or in combination of two or more.

Examples of the leveling agents containing, as a main component, a polyacrylate compound include, for example, "BYK-350", "BYK-352", "BYK-353", "BYK-354", "BYK-355", "BYK-358N", "BYK-361N", "BYK-380", "BYK-381", and "BYK-392" (BYK-Chemie GmbH).

Examples of the leveling agents containing, as a main component, a fluorine atom-containing compound include- "MEGAFACE (registered trademark) R-08", MEGAFACE "R-30", MEGAFACE "R-90", MEGAFACE "F-410", MEGAFACE "F-411", MEGAFACE "F-443", MEGAFACE "F-445", MEGAFACE "F-470", MEGAFACE "F-471", MEGAFACE "F-477", MEGAFACE "F-479", MEGAFACE "F-482", and MEGAFACE "F-483" (DIC Corporation); "SURFLON (registered trademark)S-381", SURFLON "S-382", SURFLON "S-383", SURFLON "S-393", SURFLON "SC-101", SURFLON "SC-105", "KH-40", and "SA-100" (AGC Seimi Chemical Co., Ltd.); "E1830" and "E5844" (Daikin Fine Chemical Laboratory Co., Ltd.); "F-Top EF301", "F-Top EF303", "F-Top EF351", and "F-Top EF352" (Mitsubishi Materials Electronic Chemicals Co., Ltd.).

When the polymerizable liquid crystal composition (A) contains the leveling agent, the content thereof is preferably 0.05 to 5 parts by mass, and more preferably 0.05 to 3 parts by mass, based on 100 parts by mass of the polymerizable liquid crystal compound. When the content of the leveling agent is within the above range, the polymerizable liquid crystal compound is likely to be horizontally oriented and unevenness is less likely to occur. Thereby, a smoother polarizer tends to be obtained.

The polymerizable liquid crystal composition (A) may contain additives other than the photosensitizer and the leveling agent. Examples of other additives include an antioxidant, mold release agent, stabilizer, colorant such as a bluing agent, flame retardant, lubricant, etc. When the polymerizable liquid crystal composition (A) contains the other additives, the content of the other additives is preferably more than 0% and 20% by mass or less, and more preferably more than 0% and 10% by mass or less, based on the solid content of the polymerizable liquid crystal composition (A).

The polymerizable liquid crystal composition (A) can be produced by a conventionally known preparation method, and can be usually prepared by mixing and stirring the polymerizable liquid crystal compound, the dichroic coloring matter, and if necessary, the polymerization initiator, the above additives, etc.

In the polarizing film of the present invention, the polarizer preferably has a high degree of orientation order. With a polarizer having a high degree of orientation order, a Bragg peak derived from a higher-order structure such as a hexatic phase or a crystal phase can be obtained in X-ray diffraction measurement. The Bragg peak means a peak derived from a plane periodic structure of molecular orientation. Therefore, the polarizer that forms the polarizing film of the present invention preferably exhibits the Bragg peak in X-ray diffraction measurement. That is, in the polarizer that forms the polarizing film of the present invention, the polymerizable liquid crystal compound or its polymer is preferably oriented such that the polarizers exhibits the Bragg peak in X-ray diffraction measurement. More preferably, the polymerizable liquid crystal compound or its polymer is "horizontally oriented", in which the molecules of the polymerizable liquid crystal compound are oriented in the direction in which light is absorbed. In the present invention, the polarizer preferably has a plane period interval between molecular orientations of 3.0 to 6.0 Å. The high degree of orientation order as exhibiting the Bragg peak can be achieved by controlling the type of the polymerizable liquid crystal compound to be used, the type and amount of the dichroic coloring matter, and the type and amount of the polymerization initiator.

In the polarizing film of the present invention, the polarizer may be laminated on the surface, having the specific pore size, of the base material via a photo-orientation film. When the photo-orientation film is included, the thickness of the photo-orientation film is preferably 10 to 5000 nm, more preferably 10 to 1000 nm, and even more preferably 30 to 100 nm. When the thickness of the photo-orientation film is within the above range, an orientation regulating force can be exhibited without affecting the effect of suppressing diffusion of the dichroic coloring matter in the polarizer in the polarizing film of the present invention, and the polarizer can be formed with a high orientation order.

In the polarizing film of the present invention, a phase difference plate may be laminated on the surface of the polarizer opposite to the base material via an adhesive layer or an overcoat layer and a pressure-sensitive adhesive layer in this order. When the polarizer and the phase difference plate are laminated, preferably they are laminated such that the slow axis (optical axis) of the phase difference plate and the absorption axis of the polarizer intersect with each other at substantially 45°. By laminating them such that the slow axis (optical axis) of the phase difference plate and the absorption axis of the polarizer intersect with each other at substantially 45°, a function as an elliptical polarizing plate can be obtained. Note that the substantially 45° usually means a range of 45±5°.

The polarizing film of the present invention has a configuration in which a polarizer formed from the polymerizable liquid crystal composition (A) is laminated on a surface, having a pore size of 0.45 nm to 0.57 nm, of a base material, the pore size being obtained by converting, into a diameter, an average free volume radius calculated by a positron lifetime measurement method in which the positron lifetime is measured by irradiating the surface with positrons with an injection energy of 3 kV. Thereby, a polarizing film can be obtained, having a high effect of suppressing diffusion of the dichroic coloring matter in the polarizer, being excellent in flexibility, and being less likely to cause an over-time decrease in polarization performance.

The polarizing film of the present invention is also excellent in water resistance. An amount of change in haze, occurring when the polarizing film is immersed in warm water at 53° C. for 30 minutes, is preferably 1.0 or less, more preferably 0.8 or less, and even more preferably 0.7 or less. When the amount of change in haze is less than or equal to the above upper limit, the polarizing film is excellent in water resistance and is less likely to cause cracking, peeling, floating, etc., even when placed in a high humidity environment or immersed in water. Thereby, high visibility can be ensured. The lower limit of the amount of change in haze is not particularly limited, and is usually 0.02 or more. The method for measuring the amount of change in haze is as described in examples described later.

The polarizing film of the present invention can be manufactured by a method including, for example:

forming a coating film of a polymerizable liquid crystal composition containing both a polymerizable liquid crystal compound having at least one polymerizable group and a dichroic coloring matter on a surface, having a pore size of 0.45 nm to 0.57 nm, of a base material, the pore size being obtained by converting, into a diameter, an average free volume radius calculated by a positron lifetime measurement method in which the position lifetime is measured by irradiating the surface with positrons with an injection energy of 3 kV;

removing a solvent from the coating film;

causing the polymerizable liquid crystal compound to make a phase transition to a smectic phase by heating the polymerizable liquid crystal compound to a temperature higher than or equal to a temperature at which the polymerizable liquid crystal compound makes a phase transition to a liquid phase and then by lowering the temperature; and polymerizing the polymerizable liquid crystal compound while maintaining the smectic phase.

As described above, by laminating the polarizer on the surface, having the specific pore size, of the base material, a polarizing film, having a high effect of suppressing diffusion of the dichroic coloring matter in the polarizer and being excellent in flexibility and water resistance, can be obtained. Therefore, the present invention also includes a method for manufacturing a polarizing film, including:

forming a coating film of a polymerizable liquid crystal composition (hereinafter, also referred to as a "polymerizable composition (A)") containing both a polymerizable liquid crystal compound having at least one polymerizable group and a dichroic coloring matter on a surface, having a pore size of 0.45 nm to 0.57 nm, of a base material, the pore size being obtained by converting, into a diameter, an average free volume radius calculated by a positron lifetime measurement method in which the positron lifetime is measured by irradiating the surface with positrons with an injection energy of 3 kV;

removing a solvent from the coating film;

causing the polymerizable liquid crystal compound to make a phase transition to a smectic phase by heating the polymerizable liquid crystal compound to a temperature higher than or equal to a temperature at which the polymerizable liquid crystal compound makes a phase transition to a liquid phase and then by lowering the temperature; and polymerizing the polymerizable liquid crystal compound while maintaining the smectic phase.

In the method for manufacturing a polarizing film of the present invention, as the materials, etc., that can be used for forming the polarizing film, such as the polymerizable liquid crystal composition (A) containing both a polymerizable liquid crystal compound and a dichroic coloring matter and the base material having a surface having the specific pore size, the same materials as described above as what can be used in the polarizing film of the present invention can be used.

The coating film of the polymerizable liquid crystal composition (A) can be formed, for example, by coating the polymerizable liquid crystal composition (A) onto the base material having the specific pore size directly or via an orientation film described later. Since a compound exhibiting smectic liquid crystallinity generally has a high viscosity, the viscosity may be adjusted by adding a solvent to the polymerizable liquid crystal composition (A), from the viewpoint of improving the coatability of the polymerizable liquid crystal composition (A) to facilitate the formation of the polarizer (hereinafter, a composition obtained by adding a solvent to the polymerizable liquid crystal composition is also referred to as a "polarizer-forming composition").

The solvent to be used in the polarizer-forming composition can be appropriately selected depending on the polymerizable liquid crystal compound to be used, the solubility of the dichroic coloring matter, etc. Specific examples thereof include water; alcohol solvents such as methanol, ethanol, ethylene glycol, isopropyl alcohol, propylene glycol, methyl cellosolve, butyl cellosolve, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, methyl amyl ketone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; and chlorinated hydrocarbon solvents such as chloroform and chlorobenzene. These solvents can be used alone or in combination of two or more. The content of the solvent is preferably 100 to 1900 parts by mass, more preferably 150 to 900 parts by mass, and even more preferably 180 to 600 parts by mass, based on 100 parts by mass of the solid component that forms the polymerizable liquid crystal composition (A).

Examples of the method for coating the polarizer-forming composition onto the base material include known methods such as coating methods including a spin coating method, extrusion method, gravure coating method, die coating method, bar coating method and applicator method; and printing methods including a flexographic method.

Next, the solvent is removed by drying, etc., on a condition where the polymerizable liquid crystal compound, contained in the coating film obtained from the polarizer-forming composition, is not polymerized. Thereby, a dried coating film is formed. Examples of the drying method include a natural drying method, ventilation drying method, heat drying method and decompression drying method.

Further, in order to cause the polymerizable liquid crystal compound to make a phase transition to a liquid phase, the polymerizable liquid crystal compound is heated to a temperature higher than or equal to a temperature at which the polymerizable liquid crystal compound makes a phase transition to a liquid phase, and then the temperature is lowered. Thereby, the polymerizable liquid crystal compound is caused to make a phase transition to a smectic phase (smectic liquid crystal state). Such a phase transition may be performed after the solvent in the coating film is removed, or performed simultaneously with the removal of the solvent.

By polymerizing the polymerizable liquid crystal compound while maintaining the smectic liquid crystal state of the polymerizable liquid crystal compound, a polarizer is formed as the cured product layer of the polymerizable liquid crystal composition. As the polymerization method, a photopolymerization method is preferred. In photopolymerization, the light with which the dried coating film is irradiated is appropriately selected depending on the type of the polymerizable liquid crystal compound contained in the dried coating film (particularly, the type of the polymerizable group held by the polymerizable liquid crystal compound), the type of the polymerization initiator and the amounts thereof. Specific examples of the light include one or more types of active energy rays or active electron beams selected from the group consisting of visible light, ultraviolet light, infrared light, X-rays, α-rays, β-rays, and γ-rays. Among them, ultraviolet light is preferable because it is easy to control the progress of a polymerization reaction and a photopolymerization apparatus widely used in the field can be used. It is preferred to select the types of the polymerizable liquid crystal compound contained in the polymerizable liquid crystal composition and the polymerization initiator so that photopolymerization can be performed by ultraviolet light. At the time of polymerization, a polymerization temperature can also be controlled by emitting light while cooling the dried coating film with an appropriate cooling unit. When the polymerizable liquid crystal compound is polymerized at a lower temperature by adopting such a cooling unit, a polarizer can be properly formed even if a base material having a relatively low heat resistance is used. A patterned polarizer can also be obtained by performing masking and development in the photopolymerization.

Examples of the light source for the active energy rays include a low-pressure mercury lamp, medium-pressure mercury lamp, high-pressure mercury lamp, ultra-high-pressure mercury lamp, xenon lamp, halogen lamp, carbon arc lamp, tungsten lamp, gallium lamp, excimer laser, LED light source for emitting light having a wavelength range from 380 to 440 nm, chemical lamp, black light lamp, microwave-excited mercury lamp, metal halide lamp, etc.

An ultraviolet emission intensity is usually 10 to 3,000 $mW/cm^2$. Preferably, the ultraviolet emission intensity is within a wavelength region effective for activating the polymerization initiator. A period for emitting the light is usually 0.1 seconds to 10 minutes, preferably 1 second to 5 minutes, more preferably 5 seconds to 3 minutes, and even more preferably 10 seconds to 1 minute. When emitted once or multiple times with such an ultraviolet emission intensity, the integrated amount of the light is 10 to 3,000 $mJ/cm^2$, preferably 50 to 2,000 $mJ/cm^2$, and more preferably 100 to 1,000 $mJ/cm^2$.

By performing the photopolymerization, the polymerizable liquid crystal compound is polymerized while maintaining the liquid crystal state of a smectic phase, and preferably the liquid crystal state of a higher-order smectic phase, and a polarizer is formed. The polarizer obtained by polymerizing the polymerizable liquid crystal compound while maintaining the liquid crystal state of a smectic phase has an advantage of having higher polarization performance also due to the action of the dichroic coloring matter than a conventional host-guest type polarizing film, that is, a polarizer including the liquid crystal state of a nematic phase. There is also an advantage of being more excellent in strength than a polarizer in which a dichroic coloring matter and a lyotropic liquid crystal are only coated.

The thickness of the polarizer can be appropriately selected depending on a display device to be adopted, and is preferably 0.1 μm to 5 μm, more preferably 0.3 μm to 4 μm, and even more preferably 0.5 μm to 3 μm. If the film thickness is smaller than this range, the necessary light absorption may not be obtained. If the film thickness is larger than this range, an orientation regulating force by the orientation film decreases, and hence an orientation defect tends to occur easily.

In the present invention, the polarizer may be laminated (formed) on the surface, having the above specific pore size, of the base material via the orientation film. The orientation film has an orientation regulating force by which the polymerizable liquid crystal compound is liquid-crystal-oriented in a desired direction. Preferably, the orientation film has a solvent resistance with which it does not dissolve when a composition containing a polymerizable liquid crystal compound is coated, and has a heat resistance for a heat treatment for removing the solvent or orienting the polymerizable liquid crystal compound. In the present invention, the photo-orientation film is preferred as the orientation film from the viewpoints of the accuracy and quality of an orientation angle and the water resistance and flexibility of the polarizing film including the orientation film. The photo-orientation film is also advantageous because the direction of the orientation regulating force can be arbitrarily controlled by selecting the polarization direction of polarized light to be emitted.

The photo-orientation film can usually be obtained by coating a composition containing both a polymer or monomer having a photoreactive group and a solvent (hereinafter, also referred to as a "photo-orientation film-forming composition") onto a base material and emitting polarized light (preferably, polarized UV).

The photoreactive group refers to a group that generates a liquid crystal orientation ability when irradiated with light. Specific examples thereof include groups involved in photoreactions that are the origin of the liquid crystal orientation ability, such as a molecular orientation induction or isomerization reaction, dimerization reaction, photocrosslinking reaction, or photodecomposition reaction, which are generated by light emission. Among them, a group involved in the dimerization reaction or photocrosslinking reaction is preferable because it is excellent in orientation. The photoreactive group is preferably a group having an unsaturated bond, particularly a double bond, and particularly preferably a group having at least one selected from the group consisting of a carbon-carbon double bond (C=C bond), carbon-nitrogen double bond (C=N bond), nitrogen-nitrogen double bond (N=N bond), and carbon-oxygen double bond (C=O bond).

Examples of the photoreactive group having a C=C bond include a vinyl group, polyene group, stilbene group, stilbazole group, stilbazolium group, chalcone group, cinnamoyl group, etc. Examples of the photoreactive group having a C=N bond include groups having a structure such as an aromatic Schiff base or aromatic hydrazone. Examples of the photoreactive group having an N=N bond include an azobenzene group, azonaphthalene group, aromatic heterocyclic azo group, bisazo group, formazan group, group having an azoxybenzene structure, etc. Examples of the photoreactive group having a C=O bond include a benzophenone group, coumarin group, anthraquinone group, maleimide group, etc. These groups may have substituents such as an alkyl group, alkoxy group, aryl group, allyloxy group, cyano group, alkoxycarbonyl group, hydroxyl group, sulfonic acid group, and halogenated alkyl group.

Among them, a photoreactive group involved in a photodimerization reaction is preferable, and a cinnamoyle group and a chalcone group are preferable because a photo-orientation film, having a relatively small emission amount of polarized light necessary for photo orientation and being excellent in thermal stability and over-time stability, can be easily obtained. As the polymer having the photoreactive group, particularly preferred is a polymer having a cinnamoyl group such that the end of the side chain of the polymer has a cinnamic acid structure.

By coating the photo-orientation film-forming composition onto a base material, a photo-orientation induction layer can be formed on the base material. Examples of the solvent contained in the composition include the same solvents as those described above as the solvent that can be used for forming the polarizer. The solvent can be appropriately selected depending on the solubility of the polymer or monomer having the photoreactive group.

The content of the polymer or monomer having the photoreactive group in the photo-orientation film-forming composition can be appropriately adjusted depending on the type of the polymer or monomer and the thickness of the target photo-orientation film. The content thereof is preferably at least 0.2% by mass, and more preferably within the range from 0.3 to 10% by mass, based on the mass of the photo-orientation film-forming composition. The photo-orientation film-forming composition may contain a polymer material, such as polyvinyl alcohol or polyimide, and a photosensitizer within a range where the characteristics of the photo-orientation film are not significantly impaired.

Examples of the methods for coating the photo-orientation film-forming composition onto the base material and for removing the solvent from the coated photo-orientation film-forming composition include the same methods as the methods for coating the polarizer-forming composition onto the base material and for removing the solvent.

Emission of polarized light may be performed in a mode in which polarized UV is directly emitted onto what is obtained by removing the solvent from the photo-orientation film-forming composition coated onto the base material, or in a mode in which the polarized light, which has been emitted from the base material side, is emitted by being transmitted therethrough. Particularly preferably, the polarized light is substantially parallel light. Preferably, the wavelength of the polarized light to be emitted is within a wavelength range where a photoreactive group of a polymer or monomer having the photoreactive group can absorb light energy. Specifically, UV (ultraviolet ray) having a wavelength within the range from 250 to 400 nm is particularly preferable. Examples of the light source to be used for emitting the polarized light include a xenon lamp, high-pressure mercury lamp, ultra-high-pressure mercury lamp, metal halide lamp, ultraviolet light laser such as KrF or ArF, etc. A high-pressure mercury lamp, ultra-high-pressure mercury lamp, and metal halide lamp are more preferable. Among them, a high-pressure mercury lamp, ultra-high-pressure mercury lamp, and metal halide lamp are preferable because they have a high emission intensity of an ultraviolet ray having a wavelength of 313 nm. Polarized UV can be emitted by emitting the light from the light source through an appropriate polarizer. As such a polarizer, a polarizing filter, polarizing prisms such as Glan-Thompson and Glan-Taylor, and a wire grid type polarizer can be used.

When masking is performed during rubbing or polarized light emission, a plurality of regions (patterns), where the directions of liquid crystal orientation are different, can be formed.

<Polarizing Plate>

The present invention includes a polarizing plate (elliptical polarizing plate) including the polarizing film of the present invention and a phase difference film. In the polarizing plate of the present invention, preferably the phase difference film satisfies the following expression (X):

$$100 \text{ nm} \leq Re(550) \leq 180 \text{ nm} \tag{X}$$

[where, Re(550) represents an in-plane phase difference value at a wavelength of 550 nm]. When the phase difference film has the in-plane phase difference value represented by the above (X), it functions as a so-called λ/4 plate. More preferably, the expression (X) is 120 nm≤Re(550)≤160 nm.

In the polarizing plate of the present invention, preferably the angle formed between the slow axis of the phase difference film and the absorption axis of the polarizing film is substantially 45°. In the present invention, the "substantially 45°" means 45°±5°.

Further preferably, the phase difference film satisfies the following expression (Y):

$$Re(450)/Re(550)<1 \tag{Y}$$

[Where, Re(450) and Re(550) represent in-plane phase difference values at wavelengths of 450 nm and 550 nm, respectively.]

A phase difference film satisfying the above expression (Y) has so-called reverse wavelength dispersibility and exhibits excellent polarization performance. The value of Re(450)/Re(550) is preferably 0.93 or less, more preferably 0.88 or less, even more preferably 0.86 or less, and preferably 0.80 or more, more preferably 0.82 or more.

The phase difference film may be a stretched film to which a phase difference is provided by stretching a polymer, but from the viewpoint of thinning, the polarizing plate is preferably made of a polymerizable liquid crystal composition (hereinafter, also referred to as a "polymerizable liquid crystal composition (B)") containing a polymer of a polymerizable liquid crystal compound. In the phase difference film, the polymerizable liquid crystal compound is usually polymerized in an oriented state. The polymerizable liquid crystal compound (hereinafter, also referred to as the "polymerizable liquid crystal compound (B)") that forms the phase difference film means a liquid crystal compound having a polymerizable functional group, particularly a photopolymerizable functional group.

The photopolymerizable functional group refers to a group that can be involved in a polymerization reaction by an active radical, acid, etc., generated from a photopolymerization initiator. Examples of the photopolymerizable functional group include a vinyl group, vinyloxy group, 1-chlorovinyl group, isopropenyl group, 4-vinylphenyl group, acryloyloxy group, methacryloyloxy group, oxylanyl group, oxetanyl group, etc. Among them, an acryloyloxy group, methacryloyloxy group, vinyloxy group, oxylanyl group, and oxetanyl group are preferable, and an acryloyloxy group is more preferable. The liquid crystallinity may be thermotropic liquid crystallinity or lyotropic liquid crystallinity, and the phase order structure may be nematic liquid crystal or smectic liquid crystal. The polymerizable liquid crystal compounds may be used alone or in combination of two or more.

Examples of the polymerizable liquid crystal compound (B) include compounds satisfying all of the following (A) to (D) from the viewpoints of facilitating film formation and imparting the phase difference property represented by the above expression (Y).

(A) A compound having thermotropic liquid crystallinity;
(B) Having π electrons on the major axis direction (a) of the polymerizable liquid crystal compound.
(C) Having π electrons on the direction [intersecting direction (4)] intersecting with the major axis direction (a).
(D) A polymerizable liquid crystal compound in which: a π-electron density, in the major axis direction (a), of the compound that is defined by the following expression (1)

$$D(\pi a)=N(\pi a)/N(Aa) \qquad (i)$$

[where, $N(\pi a)$ is the total number of π electrons existing in the major axis direction (a) and $N(Aa)$ is the total of molecular weight existing in the major axis direction] and a π-electron density, in the intersecting axis direction (b), of the compound that is defined by the following expression (ii):

$$D(\pi b)=N(\pi b)/N(Ab) \qquad (ii)$$

[where, $N(\pi b)$ is the total number of π electrons existing in the intersecting direction (b) and $N(Ab)$ is the total molecular weight existing in the intersecting direction (b)]

are in the relation of $$0 \le [D(\pi a)/D(\pi b)] \le 1$$

[That is, the π-electron density in the intersecting direction (b) is larger than the π-electron density in the major axis direction (a)].

When coated onto an orientation film formed, for example, by a rubbing treatment and heated to a temperature higher than or equal to its phase transition temperature, the polymerizable liquid crystal compound (B) satisfying all of the above (A) to (D) can form a nematic phase. In the nematic phase formed by orienting the polymerizable liquid crystal compound (B), the polymerizable liquid crystal compound is usually oriented such that the major axis directions are parallel to each other, and this major axis direction becomes the orientation direction of the nematic phase.

Most of the polymerizable liquid crystal compounds (B) having the above characteristics generally exhibit reverse wavelength dispersibility. Specific examples of the compound satisfying the above characteristics (A) to (D) include compounds represented by the following formula (II).

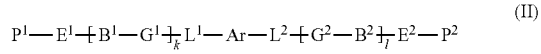
(II)

The compounds represented by the formula (II) can be used alone or in combination of two or more.

In the formula (II), Ar represents a divalent aromatic group that may have a substituent. The aromatic group referred here is a group having a planar cyclic structure in which the number of π-electrons held by the cyclic structure is [4n+2] according to Hückel's rule.

Where, n represents an integer. In the case where a ring structure is formed by containing a hetero atom such as —N═ or —S—, a case is also included, where the Hückel's rule is satisfied including the non-covalent bond electron pairs on these hetero atoms and aromaticity is held. Preferably, the divalent aromatic group contains at least one of a nitrogen atom, oxygen atom, and sulfur atom.

In the formula (II), $G^1$ and $G^2$ each independently represent a divalent aromatic group or a divalent alicyclic hydrocarbon group. Here, the hydrogen atom contained in the divalent aromatic group or the divalent alicyclic hydrocarbon group may be substituted with a halogen atom, alkyl group having 1 to 4 carbon atoms, fluoroalkyl group having 1 to 4 carbon atoms, alkoxy group having 1 to 4 carbon atoms, cyano group, or nitro group. The carbon atom forming the divalent aromatic group or the divalent alicyclic hydrocarbon group may be substituted with an oxygen atom, sulfur atom, or nitrogen atom.

In the formula (II), $L^1$, $L^2$, $B^1$, and $B^2$ are each independently a single bond or divalent linking group.

In the formula (II), k and l each independently represent an integer from 0 to 3, and satisfy the relationship of $1 \le k \le 1$. Here, when $2 \le k \le 1$, each of $B^1$ and $B^2$ and $G^1$ and $G^2$ may be the same as or different from each other.

In the formula (II), $E^1$ and $E^2$ each independently represent an alkanediyl group having 1 to 17 carbon atoms, where the hydrogen atom contained in the alkanediyl group may be substituted with a halogen atom, and —$CH_2$— contained in the alkanediyl group may be substituted with —O—, —S—, or —Si—. $P^1$ and $P^2$ each independently represent a polymerizable group or a hydrogen atom, and at least one of them is a polymerizable group.

In the formula (II), $G^1$ and $G^2$ are, each independently: preferably 1,4-phenylenediyl group that may be substituted with at least one substituent selected from the group consisting of halogen atoms and alkyl groups having 1 to 4 carbon atoms, or 1,4-cyclohexanediyl group that may be substituted with at least one substituent selected from the group consisting of halogen atoms and alkyl groups having 1 to 4 carbon atoms; more preferably 1,4-phenylenediyl group substituted with a methyl group, unsubstituted 1,4-phenylenediyl group, or unsubstituted 1,4-trans-cyclohexanediyl group; and particularly preferably unsubstituted 1,4-phenylenediyl group or unsubstituted 1,4-trans-cyclohexanediyl group. Additionally, at least one of a plurality of $G^1$ and $G^2$ that are present is preferably a divalent alicyclic hydrocarbon group, and at least one of $G^1$ and $G^2$ bound to $L^1$ or $L^2$ is more preferably a divalent alicyclic hydrocarbon group.

In the formula (II), $L^1$ and $L^2$ are, each independently, preferably a single bond, alkylene group having 1 to 4 carbon atoms, —O—, —S—, —$R^{a1}OR^{a2}$—, —$R^{a3}COOR^{a4}$—, —$R^{a5}OCOR^{a6}$—, —$R^{a7}OC═OOR^{a8}$—, —N═N—, —$CR^c$═$CR^d$—, or —C≡C—. Here, $R^{a1}$ to $R^{a8}$ each independently represent a single bond or alkylene group having 1 to 4 carbon atoms, and $R^c$ and $R^d$ represent an alkyl group having 1 to 4 carbon atoms or a hydrogen atom. $L^1$ and $L^2$ are, each independently, more preferably a single bond, —$OR^{a2-1}$—, —$CH_2$—, —$CH_2CH_2$—, —$COOR^{a4-1}$—, or —$OCOR^{a6-1}$—. Here, $R^{a2-1}$, $R^{a4-1}$, and $R^{a6-1}$ each independently represent one of a single bond, —$CH_2$—, and —$CH_2CH_2$—. $L^1$ and $L^2$ are, each independently, more preferably a single bond, —O—, —$CH_2CH_2$—, —COO—, —$COOCH_2CH_2$—, or —OCO—.

In one preferred embodiment of the present invention, at least one of $G^1$ and $G^2$ in the formula (II) is a divalent alicyclic hydrocarbon group, and a polymerizable liquid crystal compound, in which the divalent alicyclic hydrocarbon group is bound to a divalent aromatic group Ar that may have a substituent by $L^1$ and/or $L^2$ that are —COO—, is used.

In the formula (II), $B^1$ and $B^2$ are, each independently, preferably a single bond, alkylene group having 1 to 4 carbon atoms, —O—, —S—, —$R^{a9}OR^{a10}$—, —$R^{a11}COOR^{a12}$—, —$R^{a13}OCOR^{a14}$—, or —$R^{a15}OC$—$OOR^{a16}$—. Here, $R^{a9}$ to $R^{a16}$ each independently represent a single bond or alkylene group having 1 to 4 carbon atoms.

$B^1$ and $B^2$ are, each independently, more preferably a single bond, —$OR^{a10-1}$—, —$CH_2$—, —$CH_2CH_2$—, —$COOR^{a12-1}$—, or —$OCOR^{a14-1}$—. Here, $R^{a10-1}$, and $R^{a12-1}$, and $R^{a14-1}$ each independently represent any one of a single bond, —$CH_2$—, and —$CH_2CH_2$—. $B^1$ and $B^2$ are, each independently, more preferably a single bond, —O—, —$CH_2CH_2$—, —COO—, —$COOCH_2CH_2$—, —OCO—, or —$OCOCCH_2CH_2$-.

In the formula (ii), k and l are preferably within the range of 2≤k+l≤6, satisfying k+l=4 is preferred, and satisfying k=2 and l=2 is preferred, from the viewpoint of exhibiting reverse wavelength dispersibility. When k=2 and l=2 is satisfied, more preferably a symmetrical structure is formed.

In the formula (ii), $E^1$ and $E^2$ are, each independently, preferably an alkanediyl group having 1 to 17 carbon atoms, and more preferably an alkanediyl group having 4 to 12 carbon atoms.

In the formula (II), examples of the polymerizable group represented by $P^1$ or $P^2$ include an epoxy group, vinyl group, vinyloxy group, 1-chlorovinyl group, isopropenyl group, 4-vinylphenyl group, acryloyloxy group, methacryloyloxy group, oxylanyl group, and oxetanyl group. Among them, preferred are an acryloyloxy group, methacryloyloxy group, vinyloxy group, oxylanyl group, and oxetanyl group, and more preferred is an acryloyloxy group.

In the formula (II), preferably Ar has at least one selected from an aromatic hydrocarbon ring that may have a substituent, an aromatic heterocycle that may have a substituent, and an electron-withdrawing group. Examples of the aromatic hydrocarbon ring include a benzene ring, naphthalene ring and anthracene ring, and a benzene ring and naphthalene ring are preferred. Examples of the aromatic heterocycle include a furan ring, benzofuran ring, pyrrole ring, indole ring, thiophene ring, benzothiophene ring, pyridine ring, pyrazine ring, pyrimidine ring, triazole ring, triazine ring, pyrroline ring, imidazole ring, pyrazole ring, thiazole ring, benzothiazole ring, thienothiazole ring, oxazole ring, benzoxazole ring and phenanthroline ring. Among them, a thiazole ring, benzothiazole ring and benzofuran ring are preferred, and a benzothiazole group is more preferred. When Ar contains a nitrogen atom, preferably the nitrogen atom has n electrons.

In the formula (II), the total number $N_\pi$ of n electrons contained in the divalent aromatic group represented by Ar is preferably 8 or more, more preferably 10 or more, even more preferably 14 or more, and particularly preferably 16 or more. On the other hand, it is preferably 30 or less, more preferably 26 or less, and even more preferably 24 or less.

Examples of the aromatic group represented by Ar include groups represented by the following formulae (Ar-1) to (Ar-23).

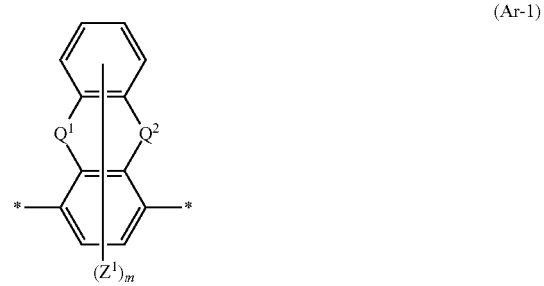

(Ar-1)

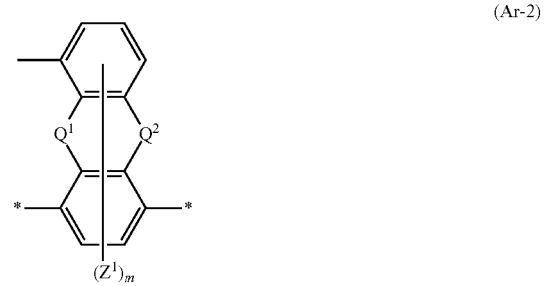

(Ar-2)

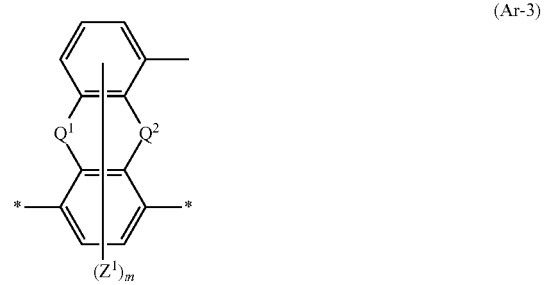

(Ar-3)

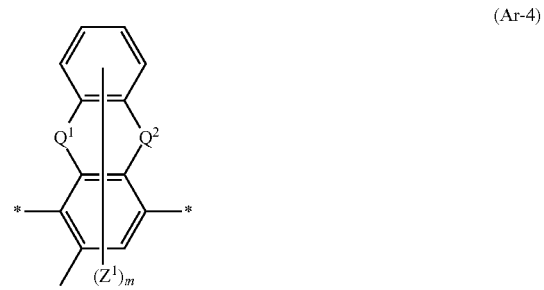

(Ar-4)

(Ar-5)

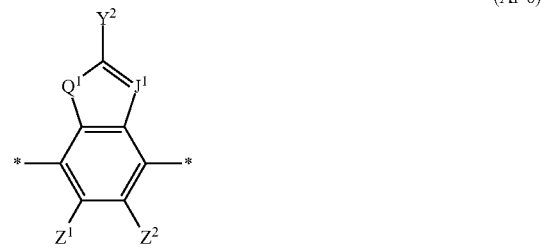

(Ar-6)

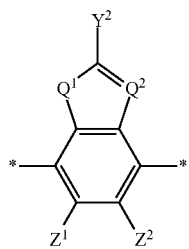
(Ar-7)
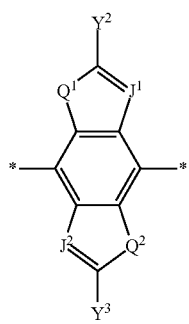
(Ar-8)
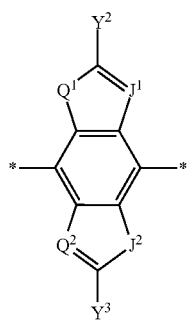
(Ar-9)
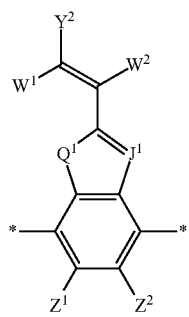
(Ar-10)
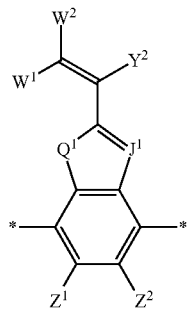
(Ar-11)
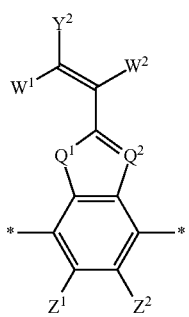
(Ar-12)
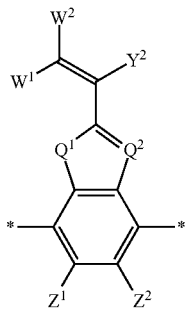
(Ar-13)
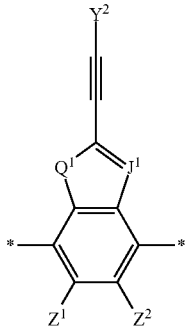
(Ar-14)
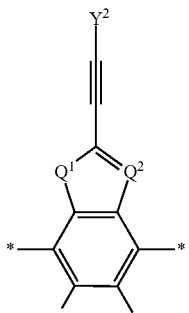
(Ar-15)
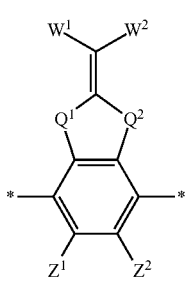
(Ar-16)

(Ar-17) 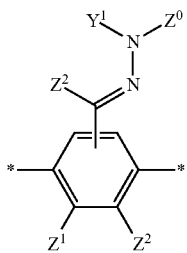

(Ar-18) 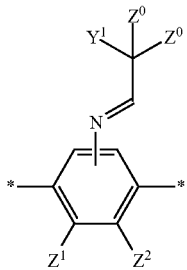

(Ar-19) 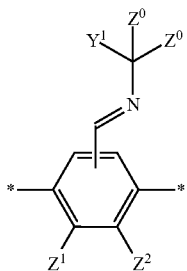

(Ar-20) 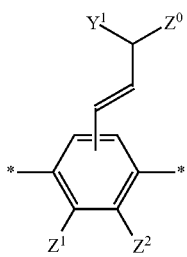

(Ar-21) 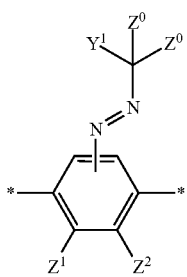

(Ar-22) 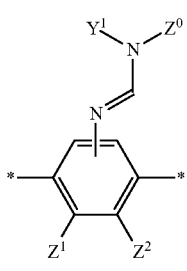

(Ar-23) 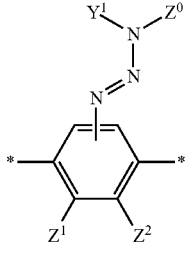

In the formulae (Ar-1) to (Ar-23), mark represents a connecting part; and $Z^0$, $Z^1$, and $Z^2$ each independently represent a hydrogen atom, halogen atom, alkyl group having 1 to 12 carbon atoms, cyano group, nitro group, alkylsulfinyl group having 1 to 12 carbon atoms, alkylsulfonyl group having 1 to 12 carbon atoms, carboxyl group, fluoroalkyl group having 1 to 12 carbon atoms, alkoxy group having 1 to 6 carbon atoms, alkylthio group having 1 to 12 carbon atoms, N-alkylamino group having 1 to 12 carbon atoms, N,N-dialkylamino group having 2 to 12 carbon atoms, N-alkylsulfamoyl group having 1 to 12 carbon atoms, or N,N-dialkylsulfamoyl group having 2 to 12 carbon atoms.

In the formulae (Ar-1) to (Ar-23), $Q^1$ and $Q^2$ each independently represent —$CR^{2'}$—S—, —NH—, —$NR^{2'}$—, —CO—, or O—. $R^{2'}$ and $R^{3'}$ each independently represent a hydrogen atom or alkyl group having 1 to 4 carbon atoms.

In the formulae (Ar-1) to (Ar-23), $J^1$ and $J^2$ each independently represent a carbon atom or nitrogen atom.

In the formulae (Ar-1) to (Ar-23), $Y^2$, and each independently represent an aromatic hydrocarbon group or aromatic heterocyclic group that may be substituted.

In the formulae (Ar-1) to (Ar-23), $W^1$ and $W^2$ each independently represent a hydrogen atom, cyano group, methyl group, or halogen atom, and m represents an integer from 0 to 6.

Examples of the aromatic hydrocarbon groups in $Y^1$, $Y^2$, and $Y^3$ include aromatic hydrocarbon groups having 6 to 20 carbon atoms, such as a phenyl group, naphthyl group, anthryl group, phenanthryl group, and biphenyl group. A phenyl group and naphthyl group are preferred, and a phenyl group is more preferred. Examples of the aromatic heterocyclic groups include aromatic heterocyclic groups that contain at least one hetero atom such as a nitrogen atom, oxygen atom, or sulfur atom and have 4 to 20 carbon atoms, such as a furyl group, pyrrolyl group, thienyl group, pyridinyl group, thiazolyl group, and benzothiazolyl group. Preferred are a furyl group, thienyl group, pyridinyl group, thiazolyl group, and benzothiazolyl group.

$Y^1$ and $Y^2$ may be, each independently, a polycyclic aromatic hydrocarbon group or polycyclic aromatic heterocyclic group that may be substituted. The polycyclic aromatic hydrocarbon group means a condensed polycyclic aromatic hydrocarbon group or a group derived from an aromatic ring assembly. The polycyclic aromatic heterocyclic group means a condensed polycyclic aromatic heterocyclic group or a group derived from an aromatic ring assembly.

In the formulae (Ar-1) to (Ar-23), $Z^0$, $Z^1$ and $Z^2$ are, each independently, preferably a hydrogen atom, halogen atom, alkyl group having 1 to 12 carbon atoms, cyano group, nitro group, and alkoxy group having 1 to 12 carbon atoms. $Z^0$ is more preferably a hydrogen atom, alkyl group having 1 to 12 carbon atoms, and cyano group. $Z^1$ and $Z^2$ are more preferably a hydrogen atom, fluorine atom, chlorine atom, methyl group, and cyano group.

In the formulae (Ar-1) to (Ar-23), $Q^1$ and $Q^2$ are preferably —NH—, —S—, —NR$^{2'}$—, and —O—, and $R^{2'}$ is preferably a hydrogen atom. Among them, —S—, —O—, and —NH— are particularly preferred.

Among the formulae (Ar-1) to (Ar-23), the formula (Ar-6) and the formula (Ar-7) are preferred from the viewpoint of molecular stability.

In the formulae (Ar-17) to (Ar-23), Y', together with the nitrogen atom to which it is bound and $Z^0$, may form an aromatic heterocyclic group. Examples of the aromatic heterocyclic group include those described above as the aromatic heterocyclic ring that Ar may have, and examples thereof include a pyrrole ring, imidazole ring, pyrroline ring, pyridine ring, pyrazine ring, pyrimidine ring, indole ring, quinoline ring, isoquinoline ring, purine ring, pyrrolidine ring, etc. This aromatic heterocyclic group may have a substituent. Alternatively, $Y^1$, together with the nitrogen atom to which it is bound and $Z^0$, may be the above polycyclic aromatic hydrocarbon group or polycyclic aromatic heterocyclic group that may be substituted. Examples thereof include a benzofuran ring, benzothiazole ring, benzoxazole ring, etc. The compounds represented by the formula (II) can be produced according to, for example, the method described in JP-A-2010-31223.

The content of the polymerizable liquid crystal compound (B) in the polymerizable liquid crystal composition (B) that forms the phase difference film is, for example, 70 to 99.5 parts by mass, preferably 80 to 99 parts by mass, and more preferably 90 to 98 parts by mass, based on 100 parts by mass of the solid content of the polymerizable liquid crystal composition (B). When the content is within the above range, the orientation of the phase difference film tends to be high. Here, the solid content refers to the total amount of the components obtained by excluding volatile components such as the solvent from the polymerizable liquid crystal composition (B).

The polymerizable liquid crystal composition (B) may contain a polymerization initiator for initiating the polymerization reaction of the polymerizable liquid crystal compound (B). The polymerization initiator may be appropriately selected from those conventionally used in the field, and may be a thermal polymerization initiator or a photopolymerization initiator. But, a photopolymerization initiator is preferable because it can initiate a polymerization reaction under a lower temperature condition. Preferred examples of the photopolymerization initiator include the same ones as described above as the photopolymerization initiators that can be used in the polymerizable liquid crystal composition (A). Additionally, the polymerizable liquid crystal composition (B) may contain, if necessary, a photosensitizer, a leveling agent, additives that have been described as additives to be contained in the polymerizable liquid crystal composition (A), etc. Examples of the photosensitizer and the leveling agent include the same ones as described above as what can be used in the polymerizable liquid crystal composition (A).

The phase difference film can be obtained, for example, as follows: A composition (hereinafter, also referred to as a "phase difference film-forming composition") is prepared by adding a solvent to the polymerizable liquid crystal composition (B) containing the polymerizable liquid crystal compound (B) and, if necessary, a polymerization initiator, an additive, etc., and by mixing and stirring them, and then the composition is coated onto a base material or an orientation film; the solvent is removed by drying; and the polymerizable liquid crystal compound (B) in the obtained coating film is cured by heating and/or active energy rays. Examples of the base material and/or the orientation film to be used for manufacturing the phase difference film include the same ones as described above as what can be used for manufacturing the polarizer of the present invention.

The solvent to be used in the phase difference film-forming composition, the method for coating the phase difference film-forming composition, the curing conditions using active energy rays are all the same as what can be adopted in the method for manufacturing the polarizer of the present invention.

The thickness of the phase difference film can be appropriately selected depending on a display device to be adopted, but from the viewpoint of thinning and flexibility, it is preferably 0.1 to 10 μm, more preferably 1 to 5 μm, and even more preferably 1 to 3 μm.

The polarizing plate of the present invention includes the polarizing film of the present invention and the phase difference film. Alternatively, the polarizing plate may further include layers (protective film, pressure-sensitive adhesive layer, etc.) other than them. In the polarizing plate of the present invention, the polarizing film of the present invention and the phase difference film may be attached via an adhesive layer or overcoat layer and a pressure-sensitive adhesive layer in this order.

The thickness of the polarizing plate of the present invention is preferably 10 to 300 μm, more preferably 20 to 200 μm, and even more preferably 25 to 100 μm, from the viewpoint of the flexibility and visibility of a display device.

<Display Device>

The present invention includes a display device including the polarizing film of the present invention or the polarizing plate of the present invention. The display device of the present invention can be obtained, for example, by attaching the polarizing film or polarizing plate of the present invention to the surface of the display device via a pressure-sensitive adhesive layer. The display device means a device having a display mechanism, and includes a light emitting element or a light emitting device as a light emitting source. Examples of the display device include a liquid crystal display device, organic electroluminescence (EL) display device, inorganic electroluminescence (EL) display device, touch panel display device, electron emission display device (electric field emission display device (FED, etc.), surface electric field emission display device (SED), electronic paper (display device using electronic ink or electrophoretic element), plasma display device, projection type display device (grating light valve (GLV) display device, display device with digital micromirror device (DMD), etc.), piezoelectric ceramic display, etc. The liquid crystal display device includes any of a transmissive liquid crystal display device, a semi-transmissive liquid crystal display device, a reflective liquid crystal display device, a direct-view liquid crystal display device, a projection type liquid crystal display device, etc. These display devices may be a display device that displays two-dimensional images, or a stereoscopic display device that displays three-dimensional images. In particular, as the display device of the present invention, an organic EL display device and a touch panel display device are preferable, and an organic EL display device is particularly preferable.

EXAMPLES

Hereinafter, the present invention will be described in more detail by using examples and comparative examples, but the present invention is not limited to these examples. Hereinafter, use amounts and parts and % representing contents are based on mass unless otherwise specified.

<Preparation of Cured Product Layer-Forming Composition>

The following components were mixed and stirred at 50° C. for 4 hours to obtain a cured product layer-forming composition (A).

Acrylate monomer:

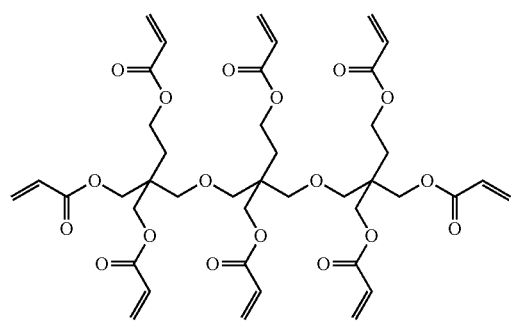

(A-1)                       70 parts

Urethane acrylate resin:

EBECRYL 4858                30 parts

Polymerization initiator:

Irgacure 907                3 parts

Solvent:

Methyl ethyl ketone         10 parts

Cured product layer-forming compositions (B) to (E) were obtained in the same manner as with the cured product layer-forming composition (A), except that the acrylate monomers were mixed in the amounts shown in Table 1.

<Structure of Acrylate Monomer>

The structures of the acrylate monomers used in examples and comparative examples are as follows.

(A-2)

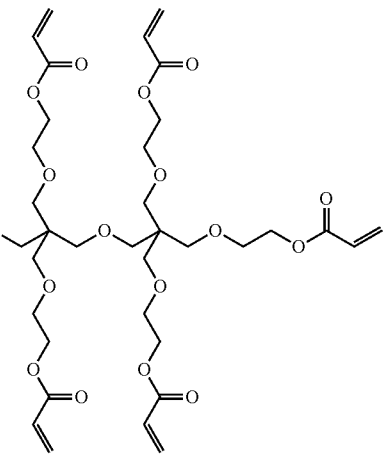

(A-3)

(A-4)

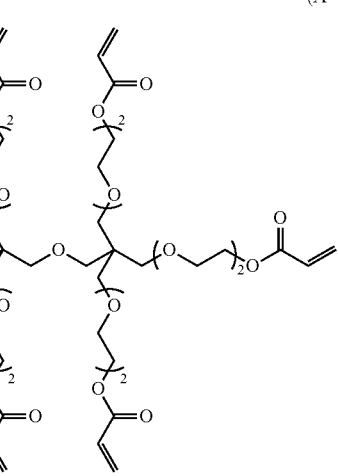

TABLE 1

| Acrylate monomer | | Urethane acrylate compound EBECRYL 4858 Parts by mass | Initiator Irg. 907 Parts by mass | Solvent MEK Parts by mass |
|---|---|---|---|---|
| Component name* | Parts by mass | | | |
| Composition A | (A-1) | 70 | 30 | 3 | 10 |
| Composition B | (A-2) | 90 | 10 | 3 | 10 |
| Composition C | (A-1) | 90 | 10 | 3 | 10 |
| Composition D | (A-3) | 70 | 30 | 3 | 10 |
| Composition E | (A-4) | 70 | 30 | 3 | 10 |

*Above-described acrylate monomers (A-1) to (A-4)

<Preparation of Polarizing Film-Forming Composition>

The following components were mixed and stirred at 80° C. for 1 hour to obtain a polarizing film-forming composition. As the dichroic coloring matter, the azo coloring matter described in the example of JP-A-2013-101328 was used.

---

Polymerizable liquid crystal compound:

---

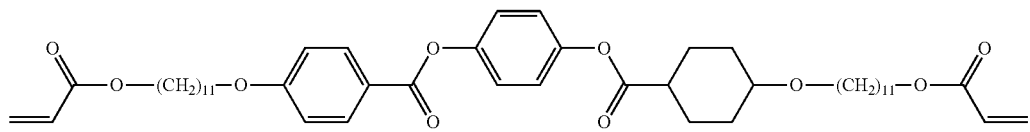

(A-6)                                                                       90 parts

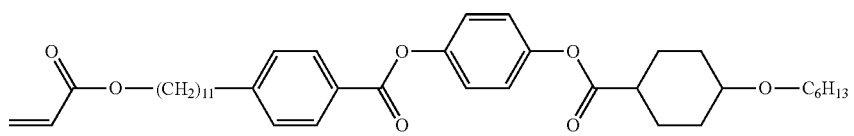

(A-7)                                                                       10 parts Dichroic coloring matter:

Azo coloring matter;

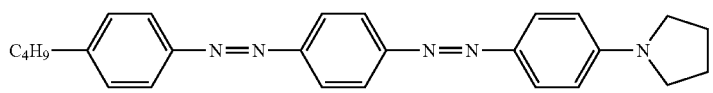

(Dichroic coloring matter A)                                                2.5 parts

(Dichroic coloring matter B)                                                2.5 parts

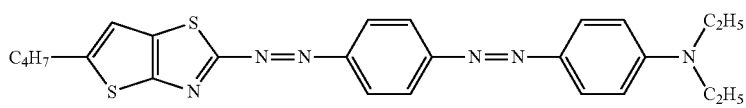

(Dichroic coloring matter C)                                                2.5 parts Polymerization initiator:

---

2-Dimethylamino-2-benzyl-1-(4-morpholinophenyl)butane-1-one (Irgacure                6 parts
369; manufactured by Ciba Specialty Chemicals Inc.)

Leveling agent:

---

Polyacrylate compound (BYK-361N; manufactured by BYK-Chemie                         1.2 parts
GmbH)

Solvent:

--- o-xylene                                                                            400 parts

Example 1

(1) Production of Photo-Orientation Film on Base Material (i) Preparation of Photo-Orientation Film-Forming Composition A photo-orientation film-forming composition was obtained by mixing the following components described in JP-A-2013-033249 and by stirring the obtained mixture at 80° C. for 1 hour.

| Photo-orientation polymer: | |
|---|---|
| 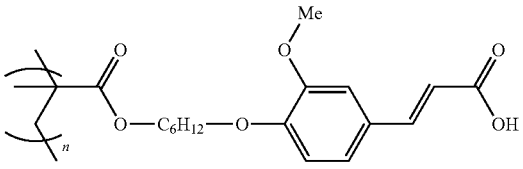 | |
| | 2 parts |
| Solvent: | |
| o-xylene | 98 parts |

(ii) Formation of Cured Product Layer on Surface of Base Resin Film

A triacetyl cellulose film (KC4UY, manufactured by Konica Minolta Inc.) was used as a base resin film, and a corona treatment was performed on the surface of the film. And then, the above cured product layer-forming composition (A) was coated by a bar coating method (#2 30 mm/s) and was heated and dried in a drying oven at 80° C. for 1 minute. Thereby, a dry film was obtained. Next, the dry film layer of the cured product layer-forming composition was irradiated with ultraviolet rays having an exposure dose of 500 mJ/cm$^2$ (at 365 nm standard) by using a UV irradiation apparatus (SPOT CURE SP-7; manufactured by Ushio Inc.). Thereby, a base film with a cured product layer, in which a cured product layer (resin layer) was formed on the surface of the base resin film, was obtained.

(iii) Formation of Photo-Orientation Film

Next, a corona treatment was performed on the surface of the cured product layer of the base film with a cured product layer, and then the photo-orientation film-forming composition was coated and dried at 120° C. to obtain a dry film. Polarized UV was emitted onto the dry film to form a photo-orientation film. Thereby, a film with a photo-orientation film was obtained. The polarized UV treatment was performed by using a UV irradiation apparatus (SPOT CURE SP-7; manufactured by Ushio, Inc.) under a condition in which the intensity measured at a wavelength of 365 nm was 100 mJ.

(2) Production of Polarizing Film

The above polarizing film-forming composition was coated onto the base film with a photo-orientation film obtained as described above by a bar coating method (#9 30 mm/s). It was heated and dried in a drying oven at 120° C. for 1 minute to cause the polymerizable liquid crystal compound to make a phase transition to a liquid phase. Then, it was cooled to room temperature to cause the polymerizable liquid crystal compound to make a phase transition to a smectic liquid crystal state. Next, the layer formed from the polarizing film-forming composition was irradiated with ultraviolet rays having an exposure dose of 1000 mJ/cm$^2$ (at 365 nm standard) by using a UV irradiation apparatus (SPOT CURE SP-7; manufactured by Ushio Inc.). Thereby, the polymerizable liquid crystal compound contained in the dry film was polymerized while maintaining the smectic liquid crystal state of the polymerizable liquid crystal compound, so that a polarizing film was formed from the dry film. The film thickness of the polarizing film at this time was measured with a laser microscope (OLS3000 manufactured by Olympus Corporation) and was found to be 2.3 µm. What was thus obtained is a polarizing film laminate containing the polarizing film and the base material. As a result of performing X-ray diffraction measurement on this polarizing film by using an X-ray diffractometer X'Pert PRO MPD (manufactured by Spectris Co., Ltd.), a sharp diffraction peak (Bragg peak) having a peak half-width (FWHM) of about 0.17° was obtained at around 2θ=20.2°. The order period (d) determined from the peak position was about 4.4 Å, and it was confirmed that a structure reflecting a higher-order smectic phase was formed.

<Measurement of Degree of Polarization Py and Single Transmittance Ty>

A degree of polarization Py and a single transmittance Ty of the polarizing film laminate of the first example were measured as follows. A transmittance (Ta) in a transmission axis direction and a transmittance (Tb) in an absorption axis direction were measured, within the wavelength range from 380 nm to 780 nm, by a double beam method using an apparatus in which a folder with a polarizer was mounted on a spectrophotometer (UV-3150 manufactured by Shimadzu Corporation). The folder was provided with a mesh that cuts an amount of light by 50 on a reference side.

A single transmittance and a degree of polarization at each wavelength were calculated by using the following expressions (Expression 1) and (Expression 2). Further, a luminosity factor-corrected single transmittance (Ty) and a luminosity factor-corrected degree of polarization (Py) were calculated by performing luminosity factor correction using a 2-degree field of view (C light source) of JIS Z 8701.

Single transmittance $Ty(\%)=(Ta+Tb)/2$   (Expression 1)

Degree of polarization $Py(\%)=(Ta-Tb)/(Ta+Tb)\times100$   (Expression 2)

Examples 2 and 3 and Comparative Examples 1 to 3

Polarizing film laminates of second and third examples and second and third comparative examples were obtained by the same method, except that the cured product layer-forming compositions (B) to (E) shown in Table 2 were used, respectively, instead of the cured product layer-forming composition (A). Further, a polarizing film laminate of a first comparative example was obtained by the same method as in the first example, except that the cured product layer-forming composition was not used.

Example 4

A polarizing film laminate of a fourth example was obtained by the same method as in the first example, except that as the base film with a cured product layer, a transparent protective film ("40CHC", manufactured by TOPPAN TOMOEGAWA OPTICAL FILM Co., Ltd.) obtained by imparting a 4 µm hard coat layer to a triacetyl cellulose film having a thickness of 40 µm was used.

Comparative Example 5

A triacetyl cellulose film (KC4UY, manufactured by Konica Minolta Inc.) was used, and a corona treatment was performed on the surface of the film. And then, a cured product layer-forming composition (F), which was an aqueous solution (viscosity: 92 cP) obtained by adding, to 100 parts of water, 7 parts of carboxyl group-modified polyvinyl alcohol ["KURARAY POVAL KL318" manufactured by KURARAY Co., Ltd.] and as a thermal cross-linking agent, 3.5 parts of water-soluble polyamide epoxy resin ["Sumirez Resin 650" (aqueous solution having a solid content of 30% by mass) obtained from Sumika Chemtex Co., Ltd.], was coated with a wire bar coater (#30) and dried at 80° C. for 5 minutes to dry the aqueous solution. Thereby, a base film with a cured product layer was obtained. A polarizing film laminate of a fourth comparative example was obtained by the same method as in the first example, except that the obtained base film with a cured product layer was used.

<Measurement of Pore Size>

For each of the base films with a cured product layer used in the first to fourth examples and the first to fourth comparative examples, a positron annihilation lifetime and a relative intensity were measured under the following conditions. Positron source: 22Na-based positron beam, gamma ray detector: barium fluoride scintillator and photomultiplier tube, positron injection energy: 3 keV, device resolution: 230 ps, measurement temperature: 22° C., count: 15,000,000. Positron lifetimes were measured according to the above measurement conditions, and three-component analysis was performed by a non-linear least-squares method. Those were labeled as τ1, τ2, and τ3 in order from the one with the smallest average annihilation lifetime, and intensities corresponding thereto were labeled as I1, I2, and I3 (I1+I2+I3=100%). The relationship between τ3 having the longest lifetime and a change in free volume is as shown by the following expression (Expression 3), and the relationship with an average free volume radius (R3: unit nm) is derived. The pore size was set to be defined by a value obtained by converting an average free volume radius into a diameter.

$$\tau 3 = (1/2)[1-(R3/(R3+0.166))+(1/2\pi)\sin(2\pi R3/(R3+0.166))]-1 \quad \text{(Expression 3)}$$

Here, the analytical value τ3 and the intensity I3 corresponding thereto were set to data indicating the average annihilation lifetime and the relative intensity. Results are shown in Table 2.

For the polarizing film laminate of each of the first to fourth examples and the first to fourth comparative examples, heat resistance was evaluated according to the following method. Results are shown in Table 2.

<Evaluation of Heat Resistance>

After the above polarizing film laminate was heated under a dry condition at 105° C. for 24 hours, the degree of polarization Py and the single transmittance Ty of the polarizing film laminate were measured again. Thereby, amounts of change rate before and after the heat resistance test were calculated.

TABLE 2

| | | | Heat resistance test at 105° C. | | | | | | |
|---|---|---|---|---|---|---|---|---|---|
| | Composition of surface of base material | Pore size (diameter d nm) | Initial | | | 24 h | | Amounts of change before and after heat resistance test | |
| | | | DR | Py | Ty | Py | Ty | ∠Py | ∠Ty |
| Example 1 | Composition A | 0.534 | 49 | 88.6 | 46.1 | 87.9 | 45.9 | −0.7 | −0.26 |
| Example 2 | Composition B | 0.538 | 52 | 90.4 | 45.7 | 89.9 | 45.5 | −0.4 | −0.20 |
| Example 3 | Composition C | 0.567 | 46 | 86.3 | 46.7 | 86.1 | 46.2 | −0.2 | −0.50 |
| Example 4 | 40CHC (commercially available product) | 0.502 | 59 | 90.3 | 46.1 | 90.0 | 46.0 | −0.3 | −0.11 |
| comparative example 2 | Composition D | 0.583 | 52 | 90.1 | 45.8 | 89.5 | 45.2 | −0.6 | −0.56 |
| comparative example 3 | Composition E | 0.609 | 59 | 90.5 | 46.0 | 89.0 | 44.3 | −1.6 | −1.66 |
| Comparative example 4 | Composition F (PVA) | 0.441 | 47 | 90.8 | 45.3 | 90.4 | 45.3 | −0.4 | −0.03 |

For the laminate of each of Examples 1 to 4 and Comparative examples 1 to 4, water resistance and flexibility were evaluated according to the following methods. Results are shown in Table 3.

<Evaluation of Water Resistance>

The haze value of the above polarizing film laminate was measured with a haze meter. Additionally, the above polarizing film laminate was put into a water tank with a heating function under a condition of 53° C. for 30 minutes. Thereafter, the haze of the laminate was measured again to calculate an amount of change rate before and after the water resistance test.

<Evaluation of Flexibility>

Flexibility was evaluated as follows by using the general paint test method-flex resistance (cylindrical mandrel method) described in JIS K 5600-5-1.

A film to be tested was cut into a rectangle having a size of 25 mm×200 mm, and it was wrapped around a mandrel rod having a diameter Φ of 2 mm such that the cured layer of a cured product-forming composition was located outside, by using a cylindrical mandrel method flex testing machine type II (manufactured by TP Giken Co., Ltd.) under a condition in which a temperature was 25° C. and a relative humidity was 55% RH. Thereafter, a flexibility test was performed. The tested film was visually checked using illuminating transmitted light in a dark room environment, so that occurrence of cracks was checked. Those in which a crack was able to be visually recognized were evaluated as "x", while those in which no crack was able to be visually recognized were evaluated as "○".

TABLE 3

|  | Composition of surface of base material | Pore size (diameter d nm) | Initial Haze | Water resistance test | | Flexibility (mandrel 2R-outside surface of cured product layer) |
|---|---|---|---|---|---|---|
|  |  |  |  | 53° C. 30 min Haze | Amounts of change before and after water resistance test Haze |  |
| Example 1 | Composition A | 0.534 | 1.24 | 1.33 | 0.09 | ○ |
| Example 2 | Composition B | 0.538 | 1.29 | 1.41 | 0.12 | ○ |
| Example 3 | Composition C | 0.567 | 1.12 | 1.20 | 0.08 | ○ |
| Example 4 | 40CHC (commercially available product) | 0.502 | 0.83 | 0.99 | 0.16 | ○ |
| Comparative example 1 | TAC | 0.580 | 1.45 | 1.85 | 0.40 | ○ |
| Comparative example 2 | Composition D | 0.583 | 1.23 | 1.34 | 0.11 | ○ |
| Comparative example 3 | Composition E | 0.609 | 1.55 | 1.65 | 0.10 | ○ |
| Comparative example 4 | Composition F (PVA) | 0.441 | 1.65 | 3.46 | 1.81 | x |

It was confirmed that the polarizing film of the present invention (polarizing film laminate of each of the first to fourth examples) having a surface having a pore size of 0.45 nm to 0.57 nm, the pore size being obtained by converting, into a diameter, an average free volume radius calculated from a positron lifetime measurement method, has good heat resistance, water resistance, and flexibility.

The invention claimed is:

1. A polarizing film comprising a polarizer that is a cured product of a polymerizable liquid crystal composition containing both a polymerizable liquid crystal compound having at least one polymerizable group and a dichroic coloring matter, said polarizer being laminated on a surface, having a pore size of 0.53 nm to 0.57 nm, of a base material,
the pore size being obtained by converting, into a diameter, an average free volume radius calculated by a positron lifetime measurement method in which the positron lifetime is measured by irradiating the surface with positrons with an injection energy of 3 kV.

2. The polarizing film according to claim 1, wherein an amount of change in haze, occurring when the polarizing film is immersed in warm water at 53° C. for 30 minutes, is 1.0 or less.

3. The polarizing film according to claim 1, wherein the dichroic coloring matter is an azo coloring matter.

4. The polarizing film according to claim 1, wherein the polymerizable liquid crystal compound exhibits smectic liquid crystallinity.

5. The polarizing film according to claim 1, wherein the polarizer exhibits a Bragg peak in an X-ray analysis measurement.

6. The polarizing film according to claim 1, wherein the surface, on which the polarizer is laminated, of the base material is made of a cured layer of a curable composition containing a radically polymerizable monomer.

7. The polarized light according to claim 1, wherein the surface, on which the polarizer is laminated, of the base material is made of a cured layer of a curable composition containing a polymerizable monomer having a (meth)acryloyloxy group.

8. The polarizing film according to claim 1, wherein the polarizer is laminated on the surface of the base material via a photo-orientation film.

9. A polarizing plate comprising the polarizing film according to claim 1 and a phase difference film which satisfies an expression (X):

$$100 \text{ nm} \leq Re(550) \leq 180 \text{ nm} \quad (X)$$

wherein, Re (550) represents an in-plane phase difference value at a wavelength of 550 nm, in which polarizing plate an angle between a slow axis of the phase difference film and an absorption axis of the polarizing film is substantially 45°.

10. The polarizing plate according to claim 9, wherein the phase difference film satisfies an expression (Y):

$$Re(450)/Re(550) < 1 \quad (Y)$$

wherein, Re(450) and Re(550) represent in-plane phase difference values at wavelengths of 450 nm and 550 nm, respectively.

11. The polarizing plate according to claim 9, wherein the phase difference film is made of a polymer of a polymerizable liquid crystal compound.

12. A display device comprising the polarizing film according to claim 1.

13. A method for manufacturing a polarizing film, comprising:
forming a coating film of a polymerizable liquid crystal composition containing both a polymerizable liquid crystal compound having at least one polymerizable group and a dichroic coloring matter on a surface, having a pore size of 0.53 nm to 0.57 nm, of a base material, the pore size being obtained by converting, into a diameter, an average free volume radius calculated by a positron lifetime measurement method in which the positron lifetime is measured by irradiating the surface with positrons with an injection energy of 3 kV;
removing a solvent from the coating film;
causing the polymerizable liquid crystal compound to make a phase transition to a smectic phase by heating the polymerizable liquid crystal compound to a temperature higher than or equal to a temperature at which the polymerizable liquid crystal compound makes a phase transition to a liquid phase and then by lowering the temperature; and
polymerizing the polymerizable liquid crystal compound while maintaining the smectic phase.

14. A display device comprising the polarizing plate according to claim 9.

* * * * *